United States Patent
Yi et al.

(10) Patent No.: US 8,421,229 B2
(45) Date of Patent: *Apr. 16, 2013

(54) SEMICONDUCTOR DEVICE HAVING METAL LINES WITH SLITS

(75) Inventors: Sang-Hyun Yi, Suwon-si (KR); Young-Nam Kim, Suwon-si (KR)

(73) Assignee: Mosaid Technologies Incorporated, Ottawa (CA)

( * ) Notice: Subject to any disclaimer, the term of this patent is extended or adjusted under 35 U.S.C. 154(b) by 0 days.

This patent is subject to a terminal disclaimer.

(21) Appl. No.: 12/958,287

(22) Filed: Dec. 1, 2010

(65) Prior Publication Data

US 2011/0068474 A1 Mar. 24, 2011

Related U.S. Application Data

(60) Continuation of application No. 11/882,805, filed on Aug. 6, 2007, now Pat. No. 7,863,746, which is a continuation-in-part of application No. 11/806,562, filed on Jun. 1, 2007, now Pat. No. 7,847,403, which is a continuation of application No. 10/885,971, filed on Jul. 8, 2004, now Pat. No. 7,233,070, which is a division of application No. 10/035,247, filed on Jan. 4, 2002, now Pat. No. 6,777,806.

(30) Foreign Application Priority Data

Feb. 20, 2001 (KR) .................. 10-2001-0008480

(51) Int. Cl.
*H01L 29/40* (2006.01)
(52) U.S. Cl.
USPC ....................................... 257/758

(58) Field of Classification Search .................. 257/750, 257/758
See application file for complete search history.

(56) References Cited

U.S. PATENT DOCUMENTS

| | | | |
|---|---|---|---|
| 4,457,345 A | 7/1984 | Von Blucher et al. |
| 4,467,345 A | 8/1984 | Ozawa |
| 4,835,591 A | 5/1989 | Matsukawa |
| 5,229,642 A | 7/1993 | Hara et al. |
| 5,329,162 A | 7/1994 | Nadaoka |
| 5,382,831 A | 1/1995 | Atakov et al. |
| 6,091,628 A | 7/2000 | Kim |

FOREIGN PATENT DOCUMENTS

| | | |
|---|---|---|
| JP | 10-084059 A | 3/1998 |
| KR | 10-1999-0026137 A | 4/1999 |
| KR | 10-2000-0033091 A | 6/2000 |

OTHER PUBLICATIONS

AMD Athlon "Copper" Processor—Report No. SCA 0009-659—Integrated Circuit Engineering, 17350 N. Hartford Drive, Scottsdale, AZ 85255 (Actual publication date unknown. On information and belief, the AMD Athlon reference was generated and made available to the public in Sep. 2000. The actual chip specimen that was the subject of the report was produced in the 29th week of 2000, the week beginning Jul. 17, 2000. Similar chips were available to the public as early as Aug. 1999.)

*Primary Examiner* — Bradley K Smith
(74) *Attorney, Agent, or Firm* — Lee & Morse, P.C.

(57) ABSTRACT

A semiconductor device including a semiconductor substrate, an integrated circuit on the semiconductor substrate, an insulation layer covering the integrated circuit, and a plurality of metal line patterns on the insulation layer. First and second adjacent metal line patterns of the plurality of metal line patterns are spaced apart from each other by a space, and each of the first and second adjacent metal line patterns has at least one slit.

19 Claims, 25 Drawing Sheets

SEMICONDUCTOR DEVICE HAVING METAL LINES WITH SLITS

CROSS-REFERENCE TO RELATED APPLICATIONS

The present application is a continuation of application Ser. No. 11/882,805, filed Aug. 6, 2007, now U.S. Pat. No. 7,863,746, which in turn is a continuation-in-part of application Ser. No. 11/806,562, filed on Jun. 1, 2007, U.S. Pat. No. 7,847,403 B2, which is a continuation application based on Ser. No. 10/885,971, filed Jul. 8, 2004, now U.S. Pat. No. 7,233,070 B2, which is a divisional application based on Ser. No. 10/035,247, filed Jan. 4, 2002, now U.S. Pat. No. 6,777,806 B2, which claims the priority of Korean Patent Application No. 10-2001-8480, filed Feb. 20, 2001, in the Korean Intellectual Property Office. The disclosures of all of the above applications are hereby incorporated herein in their entirety by reference.

BACKGROUND OF THE INVENTION

1. Field of the Invention

Embodiments relate to a semiconductor device and a method of manufacturing the same. More specifically, embodiments are directed to the techniques which may prevent a crack from occurring in the layers underlying a metal line layer using slits in the metal lines or a space between adjacent metal line layers.

2. Description of the Related Art

Semiconductor devices generally have a multi-layered structure. When manufacturing such semiconductor devices having a multi-layered structure, only a metal line pattern is inspected, but stresses that are applied to, for example, an insulation layer beneath the metal layer are not considered. Such stresses (e.g., a thermal stress) may cause cracks in a (the) layer(s) underlying the metal layer, for example, the insulation layer. As a result, characteristics of a semiconductor device may deteriorate.

FIG. 1 illustrates a schematic cross-sectional view of a conventional semiconductor device having a multi-layered structure. The semiconductor memory device includes a first insulation layer 12, a resistive layer 13, a second insulation layer 14, a barrier layer 15, and a metal line layer 16, which are sequentially formed on a substrate 11.

In the semiconductor device having such a multi-layered structure of FIG. 1, when a subsequent annealing process is performed after forming the metal line layer 16, the stress structure is changed. In other words, due to a thermal stress, the stress direction in one or more of the layers 13 to 16 is changed as shown in FIGS. 2A and 2B. FIG. 2A illustrates a cross-sectional view of a stress direction before an annealing process is performed, and FIG. 2B illustrates a cross-sectional view of a stress direction in underlying layers after an annealing process is performed. In FIGS. 2A and 2B, the arrows denote the stress direction.

As the direction of a stress is changed, the stress is accumulated and, thus, a crack 17 may occur in a portion of the second insulation layer 14 corresponding to a gap in the metal line layer 16 as shown in FIG. 1. FIGS. 4A to 4D are photographs illustrating cracks that occur due to a stress in the conventional semiconductor device. Furthermore, when a crack is deepened, as shown in FIGS. 3A and 3B, the resistive layer 13 may be destroyed, thereby causing a low reliability. FIGS. 3A and 3B are photographs illustrating a crack that occurs in the resistive layer 13.

Japanese Patent Publication No. 10-84059 describes a technique that relaxes the concentration of stress on the peripheral edge of a metal board to prevent an underlying ceramic board from deteriorating in mechanical strength and to protect it against cracking. In this technique a groove is provided inside the peripheral edge of one of the surfaces of the metal plate whose other surface is bonded to a high-thermal conductivity silicon nitride board (ceramic board).

U.S. Pat. No. 5,229,642 describes a technique that forms slits or rows of small holes in corner portions of a guard ring to prevent a passivation film on the guard ring from being cracked by stresses caused by a resin mold package concentrating in the four corners of the semiconductor substrate.

However, the prior art as described above does not suggest a technique that prevents a crack from occurring in one or more layers underlying the metal line layer due to the size of the metal line or a gap between two adjacent metal line layers.

SUMMARY OF THE INVENTION

Embodiments of the present invention are directed to a semiconductor device, which overcome one or more of the problems associated with the related art.

It is a feature of an embodiment to provide a semiconductor device that reduces or prevents a crack from occurring in a (the) layer(s) underlying a metal line layer.

It is another feature of an embodiment to provide a semiconductor device that may be highly reliable and readily manufacturable.

At least one of the above and other features of an embodiment may be realized by providing semiconductor device including a semiconductor substrate, an integrated circuit on the semiconductor substrate, an insulation layer covering the integrated circuit, and a plurality of metal line patterns on the insulation layer, wherein first and second adjacent metal line patterns of the plurality of metal line patterns are spaced apart from each other by a space, and each of the first and second adjacent metal line patterns has at least one slit.

The space may be less than about 10 µm. The slits may be less than about 4 µm away from the space. The slits may be parallel to the space.

The integrated circuit may include at least one of a memory device, a logic device and a embedded memory logic device, and wherein at least one of the first and second metal line patterns is a ground line or a power supply line.

The integrated circuit may include the memory device, and the memory device may be one of a static random access memory (SRAM) device, a flash memory device and a phase change memory device.

The integrated circuit may include the SRAM device, and the SRAM device may include a CMOS SRAM cell including a pair of driver transistors, a pair of load transistors and a pair of transfer transistors, and wherein the first metal line pattern is electrically connected to source regions of the pair of driver transistors and the second metal line pattern is electrically connected to source regions of the pair of load transistors. The integrated circuit may include the flash memory device, and the flash memory device may include a NAND string including a ground selection transistor, a plurality of cell transistors and a string selection transistor which are serially connected to one another, and wherein the first metal line pattern is electrically connected to a source region of the ground selection transistor. The NAND string may correspond to a lower NAND string, and the semiconductor device may include an upper NAND string stacked over the lower NAND string, wherein the first metal line pattern is electrically connected to the upper NAND string.

The integrated circuit includes the logic device, and the logic device may include an N-channel MOS transistor having an N-type source region and an N-type drain region formed in the semiconductor substrate, and a P-channel MOS transistor having a P-type source region and a P-type drain region formed in the semiconductor substrate, wherein the first metal line pattern is electrically connected to the N-type source region of the N-channel MOS transistor, and the second metal line pattern is electrically connected to the P-type source region of the P-channel MOS transistor.

At least one of the above and other features of an embodiment may be realized by providing a semiconductor device including a semiconductor substrate, an integrated circuit on the semiconductor substrate, an insulation layer covering the integrated circuit, first and second metal line patterns on the insulation layer, the first and second metal line patterns being parallel and spaced apart from each other, each of the first and second metal line patterns having at least one slit, and a third metal line pattern on the insulation layer, the third metal line pattern being perpendicular to the first and second metal line pattern, the third metal line pattern having at least one slit.

The third metal line pattern may be adjacent to the second metal line pattern and opposite to the first metal line pattern, and wherein the third metal line pattern is spaced apart from the second metal line pattern. The third metal line pattern may be spaced less than about 1 μm apart from the second metal line pattern.

The third metal line pattern is connected to the second metal line pattern and opposite to the first metal line pattern.

The integrated circuit may include at least one of a memory device, a logic device and a embedded memory logic device, and wherein at least one of the first and second metal line patterns is a ground line or a power supply line.

The integrated circuit may include the memory device, and the memory device may be one of a static random access memory (SRAM) device, a flash memory device and a phase change memory device.

The integrated circuit may include the SRAM device, and the SRAM device may include a CMOS SRAM cell including a pair of driver transistors, a pair of load transistors and a pair of transfer transistors, and wherein the first metal line pattern is electrically connected to source regions of the pair of driver transistors and the second metal line pattern is electrically connected to source regions of the pair of load transistors.

The integrated circuit may include the flash memory, and the flash memory device may include a NAND string including a ground selection transistor, a plurality of cell transistors and a string selection transistor which are serially connected to one another, and wherein the first metal line pattern is electrically connected to a source region of the ground selection transistor. The NAND string may correspond to a lower NAND string, and the semiconductor device further may include an upper NAND string stacked over the lower NAND string, wherein the first metal line pattern is electrically connected to the upper NAND string.

The integrated circuit may include the logic device, and the logic device may include an N-channel MOS transistor having an N-type source region and an N-type drain region formed in the semiconductor substrate, and a P-channel MOS transistor having a P-type source region and a P-type drain region formed in the semiconductor substrate, wherein the first metal line pattern is electrically connected to the N-type source region of the N-channel MOS transistor, and the second metal line pattern is electrically connected to the P-type source region of the P-channel MOS transistor.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Figure 1:
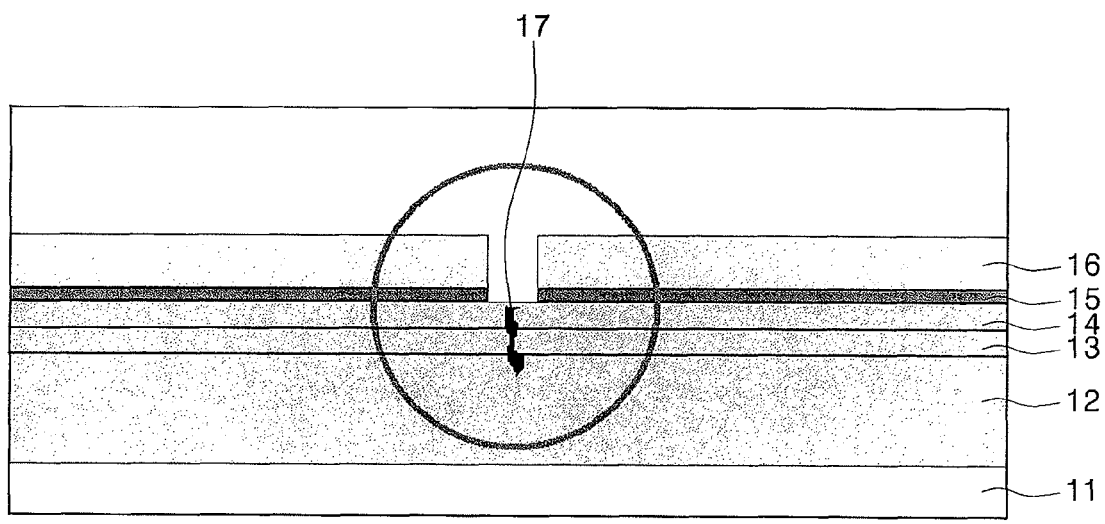
FIG. 1 illustrates a schematic cross-sectional view of a conventional semiconductor device having a multi-layered structure according to the prior art.
Figure 2A:
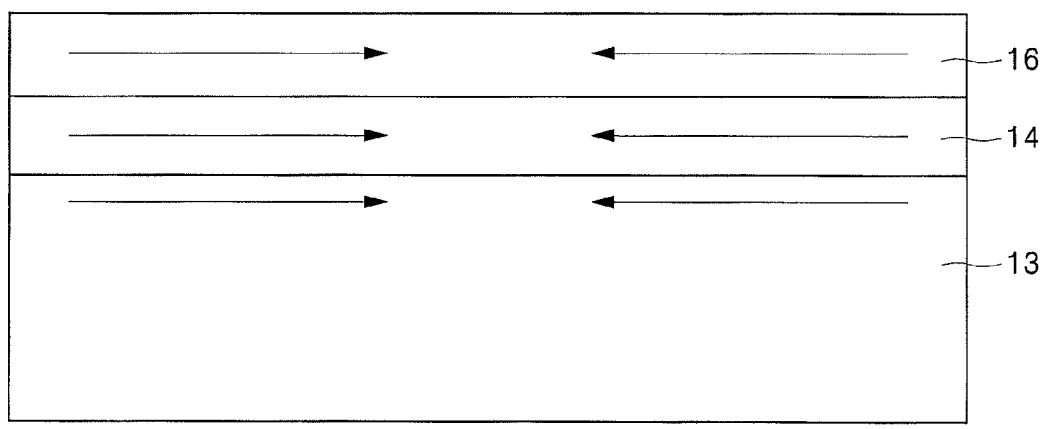
FIG. 2A illustrates a schematic cross-sectional view of the direction of a stress before an annealing process is performed according to the prior art.
Figure 2B:
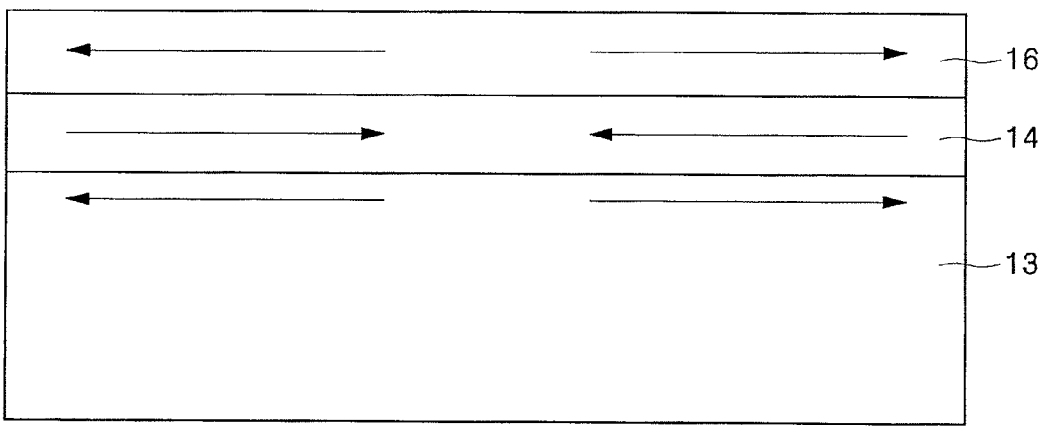
FIG. 2B illustrates a schematic cross-sectional view of the direction of a stress after an annealing process is performed according to the prior art.
Figure 3A:
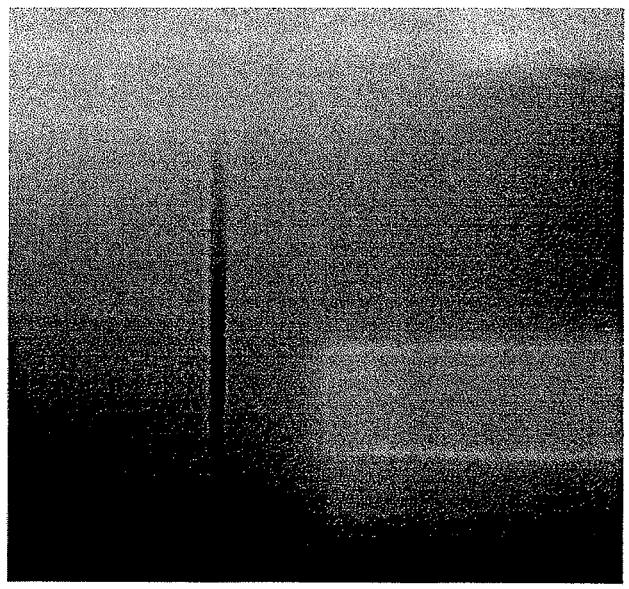
FIGS. 3A and 3B are SEM micrographs illustrating a crack that occurs in the resistive layer.
Figure 3B:
Figure 4A:
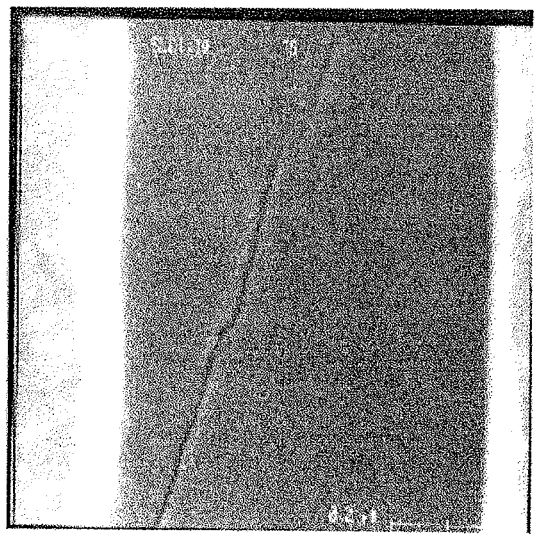
FIGS. 4A to 4D are SEM micrographs illustrating cracks that occur due to a stress in the conventional semiconductor device.
Figure 4B:
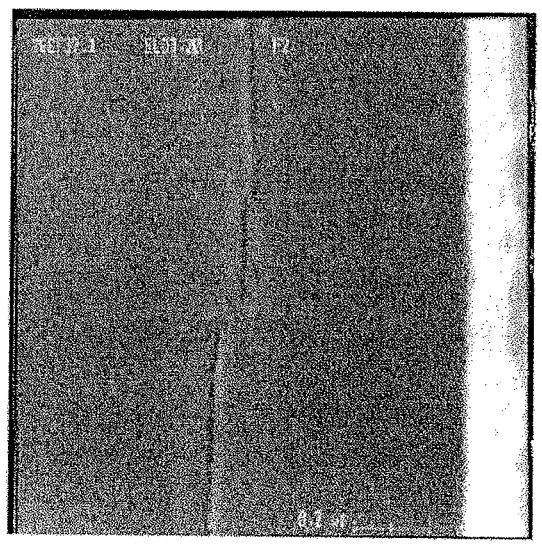
Figure 4C:
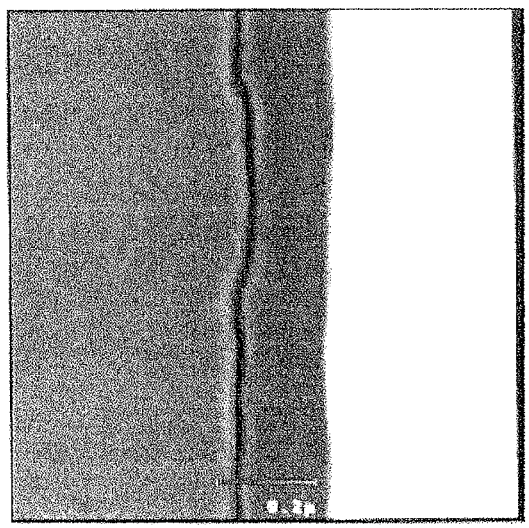
Figure 4D:
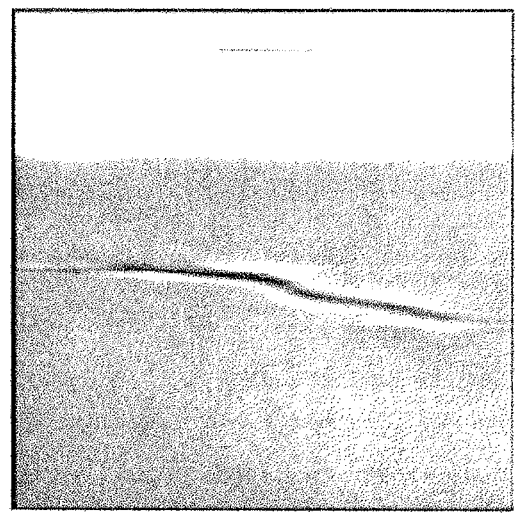

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 5:
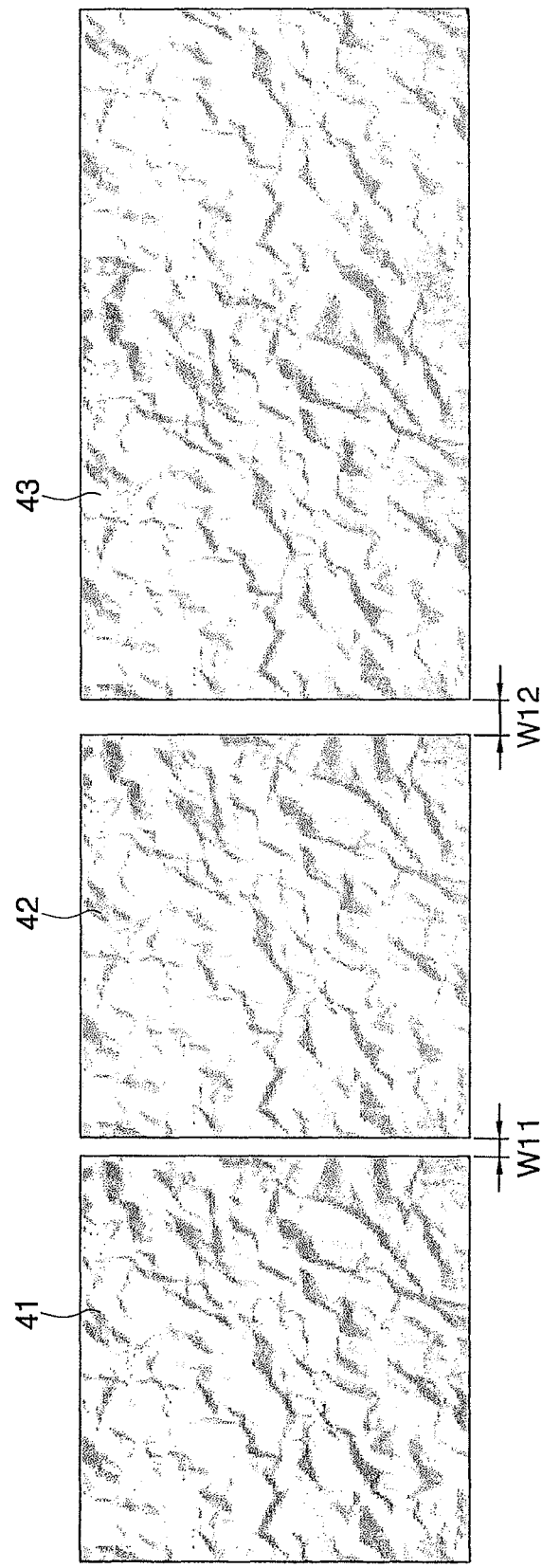
FIG. 5 is a SEM micrograph illustrating a front surface of a semiconductor device according to a first preferred embodiment of the present invention.

FIG. 5 is a SEM micrograph illustrating the front surface of a semiconductor device according to a first preferred embodiment of the present invention. As shown in FIG. 5, two adjacent metal line patterns 41 and 42 are spaced apart from each other, and two adjacent metal line patterns 42 and 43 are spaced apart from each other. A space between the two adjacent metal line patterns 41 and 42 has a width W11, and a space between the two adjacent metal line patterns 42 and 43 has a width W12. The metal line patterns 41 to 43 may have a relatively large surface area size of, e.g., greater than 30 μm×30 μm. This is because, if the metal line patterns 41 to 43 have a relatively small surface area size of, e.g., less than 30 μm×30 μm, few cracks may occur in one or more layers underlying the metal line layer, e.g., the insulating layer. However, the surface area size of the metal line patterns is not limited to the above value in the present invention.

Even though not shown, the semiconductor device of FIG. 5 may have a multi-layered structure. For example, as in FIG. 1, the semiconductor memory device includes a first insulation layer, a resistive layer, a second insulation layer, a barrier layer, and a metal line layer, which are sequentially formed in this order on a substrate.

The widths W11 and W12 are sufficiently wide to prevent a crack from occurring in one or more layers underlying the metal line patterns. Preferably, the widths W11 and W12 are greater than 1.0 μm. To accommodate a high stress resulting from a process parameter, it is more preferable that the widths W11 and W12 are at least 1.5 μm. However, if the widths W11 and W12 are very wide, the integration level of the semiconductor device is lowered, and thus it is undesirable that the widths W11 and W12 are very wide.

Figure 6:
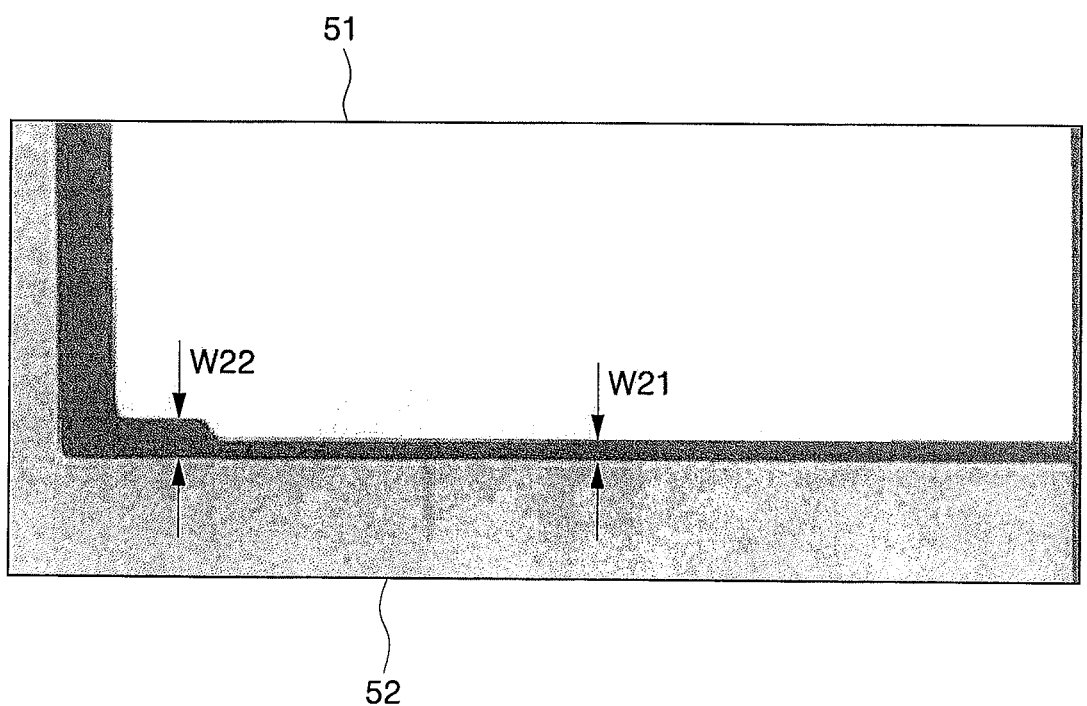
FIG. 6 is a SEM micrograph illustrating an occurrence of a crack due to a width of a space between the metal line patterns.

FIG. 6 is a SEM micrograph illustrating an occurrence of a crack due to a width of the space between the metal line patterns. In FIG. 6, the black portion denotes a space between two adjacent metal line patterns 51 and 52. A width W21 of the space is 0.75 μm, and a width W22 of the space is 1.31 μm. As shown in FIG. 6, a crack occurs not in a portion of one or more layers (e.g., the insulating layer) underlying the metal layers which correspond to the width W22, but in one or more layers underlying the metal layers which correspond to the width W21.

Figure 7:
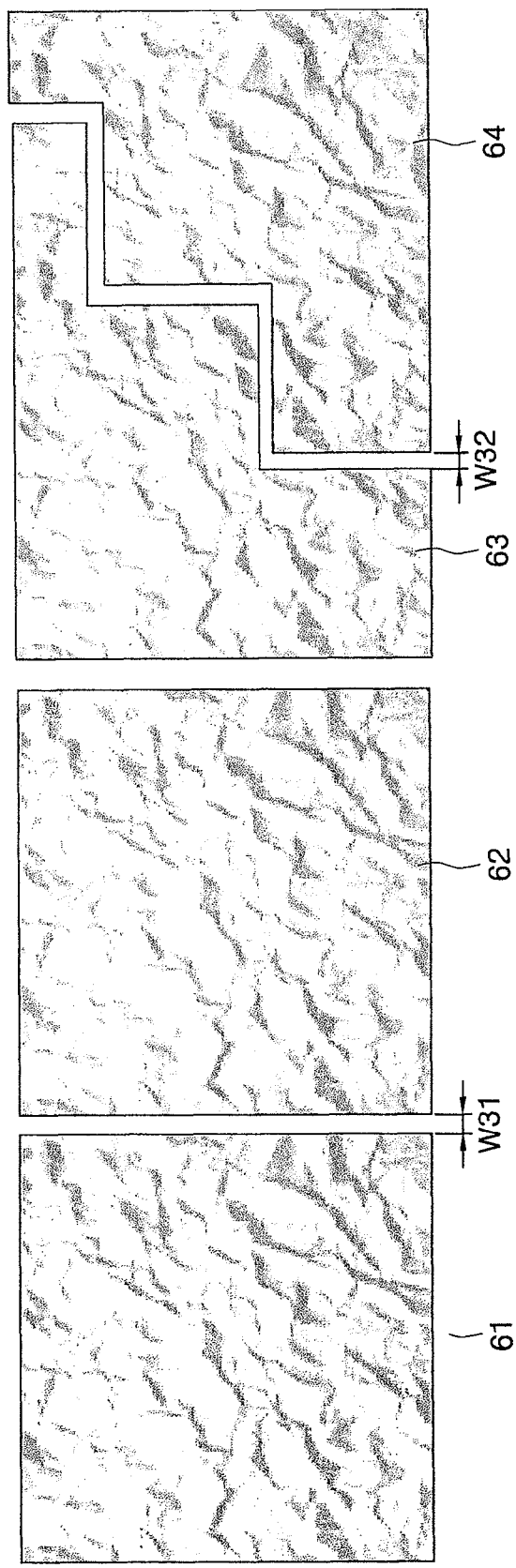
FIG. 7 is a SEM micrograph illustrating a front surface of the semiconductor device having metal line patterns according to the first preferred embodiment of the present invention.

FIG. 7 is a SEM micrograph illustrating a front surface of a semiconductor device having an alternate metal line pattern according to a first preferred embodiment of the present invention. As shown in FIG. 7, the metal line patterns 63 and 64 have a bent space therebetween. As described above, it is preferred that a space between two adjacent metal line patterns 61 and 62 or 62 and 63 is at least 1.0 μm in width. However, if the bent space between the metal line patterns 63 and 64 is 1.0 μm, a crack is likely to occur in one or more layers underlying the metal line layer. Therefore, if a space between two metal line patterns has one or more bent portions or one or more step portions, it is preferable that the width of the bent space is greater than 1.5 μm.

Meanwhile, it is difficult to form a space having a width of greater than 1.0 μm or 1.5 μm between two adjacent metal line patterns and still achieve high integration. In order to solve such a problem, a second preferred embodiment of the present invention forms a slit at a distance of within, preferably, 4.0 μm from a space between two adjacent metal line patterns.

Figure 8:
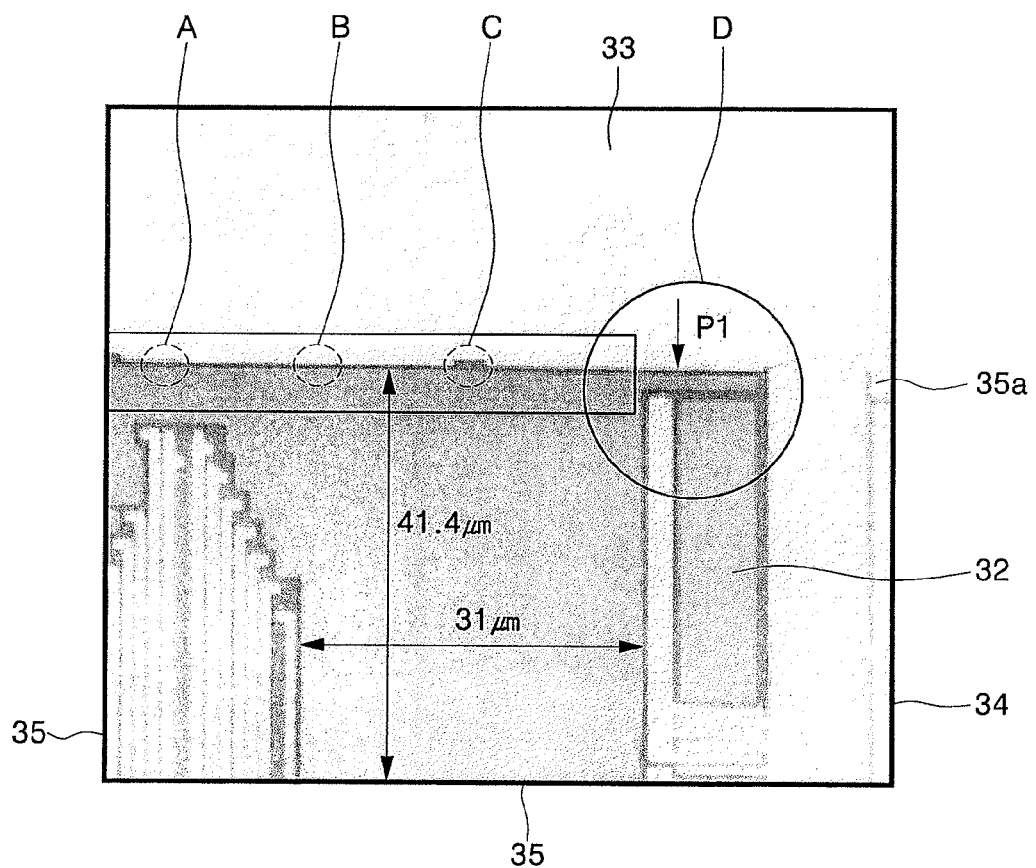
FIGS. 8 to 10 are SEM micrographs illustrating a background art related to the second preferred embodiment of the present invention.
Figure 9:
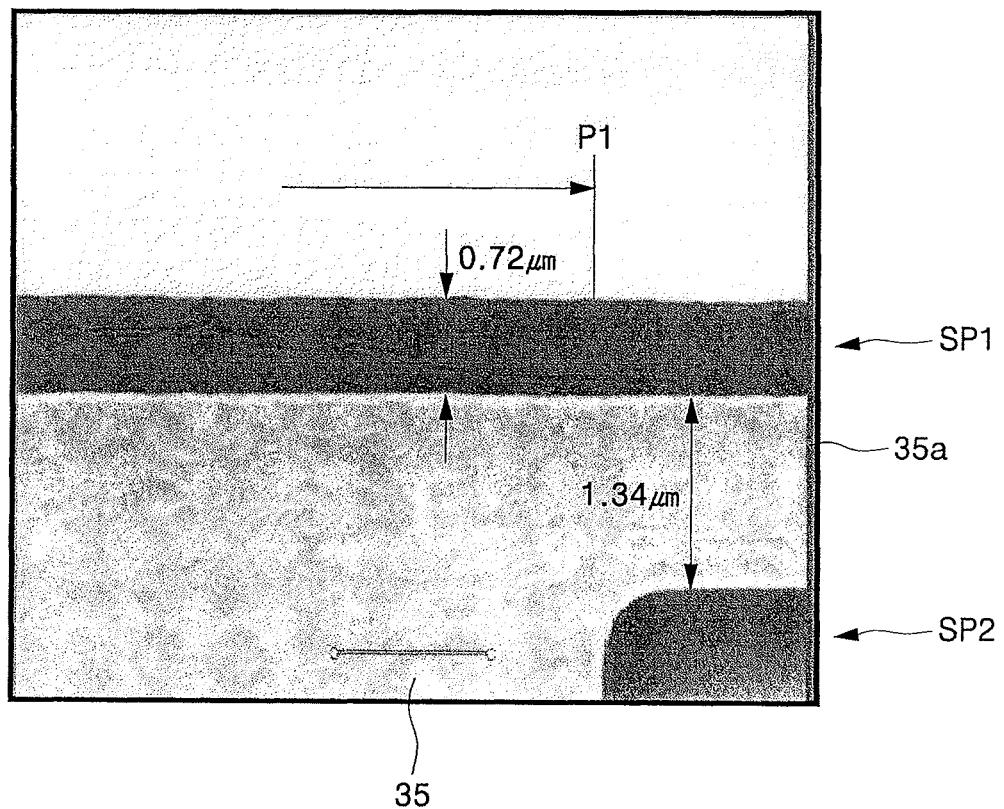
Figure 10:
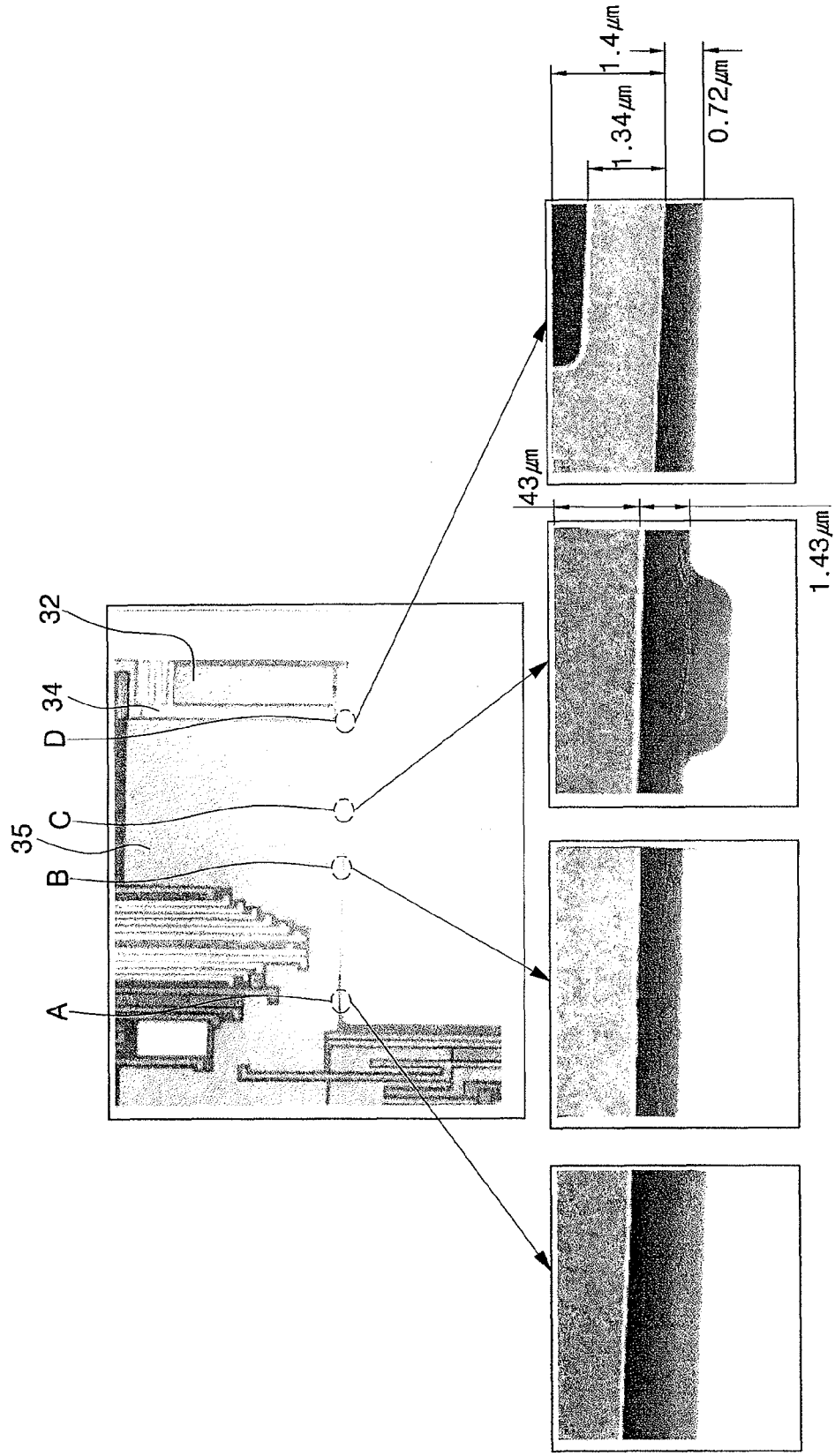

FIGS. 8 to 10 provide the background art related to the second preferred embodiment of the present invention. FIG. 8 is a SEM micrograph illustrating a portion of a conventional semiconductor device, and FIG. 9 is an enlarged view illustrating a portion D of FIG. 8. FIG. 10 is a SEM micrograph illustrating a progressive state of a crack for an area size of the metal line patterns and a space width between the metal line patterns. In FIGS. 8 to 10, reference numerals 32 to 36 denote metal line patterns, and black lines denote spaces between the two adjacent metal line patterns. In FIG. 8, a portion defined by a dotted line denotes a region where a crack occurs.

Referring to FIGS. 8 and 9, a crack does not occur in a portion of a space SP1 corresponding to the metal line patterns 36, whereas a crack does occur in a portion of the space SP1 between the metal line patterns 33 and 35. At this point, the generated crack stops at a position P1. This is because the growth of a crack is hindered by a space SP2 between a portion 35a of the metal line pattern 35 and an upper portion of the metal line pattern 34.

For more detail, as shown in FIG. 10, a crack does not occur in a portion A of the space SP1 having a width of 1.43 μm, but a crack occurs in portion B of the space SP1 having a width of 0.8 μm. The crack that occurs in a portion B of the space SP1 goes through a portion C of the space SP1 having a width of 1.43 μm, and then stops at a position P1 before a portion D of the space SP1 having a width of 0.72 μm. The reason for this is that the space SP2 serves to stop growth of a crack. That is, it is understood that if a slit is formed that exposes a layer underlying the metal layer, e.g., the insulation layer, a crack no longer occurs.

Figure 11:
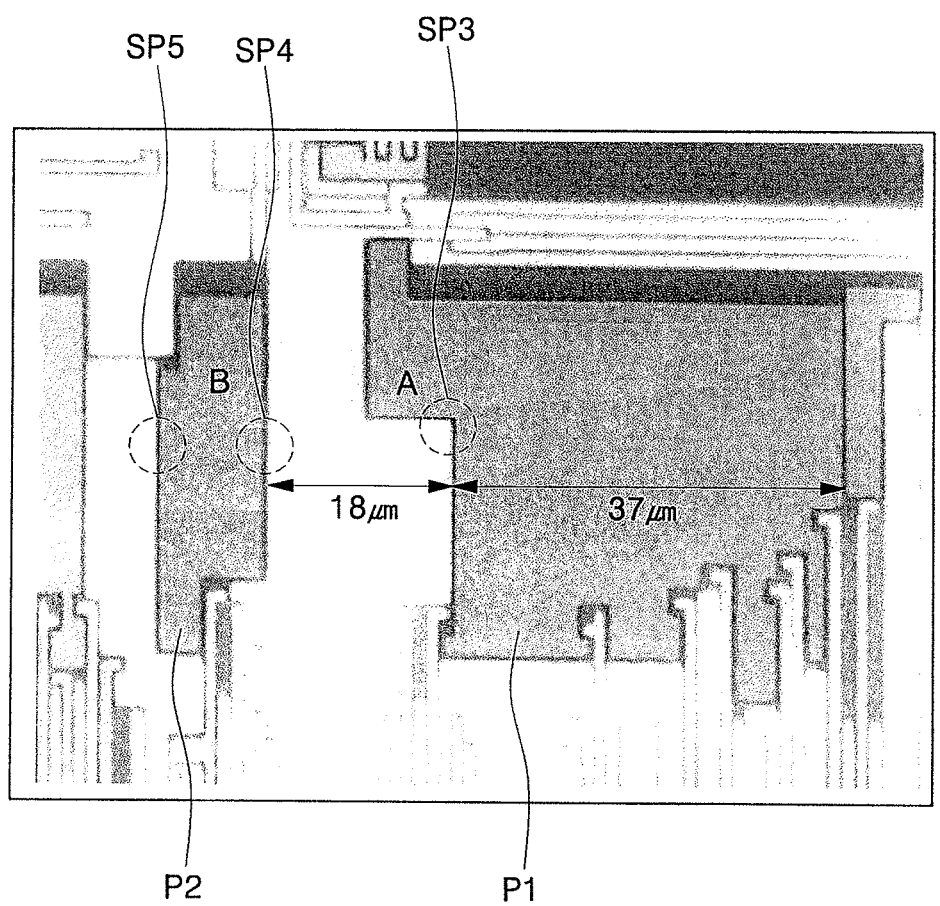
FIG. 11 is a SEM micrograph illustrating another background art related to the second preferred embodiment of the present invention.

FIG. 11 provides further background art related to the second preferred embodiment of the present invention. As shown in FIG. 11, a metal line pattern P1 is interposed between metal line patterns having a relatively large surface area size, while a metal line pattern P2 is interposed between metal line patterns having a relatively small surface area size. Spaces SP3 and SP4 have a width of 0.7 μm. Even though the space SP4 has a width of 0.7 μm, which is less than 1.0 μm, since the metal line pattern P2 is interposed between the long slim metal line patterns that are formed to be parallel to each other, a crack does not occur in the space SP4. On the other hand, since the metal line pattern P1 is interposed between the metal line patterns having a relatively large surface area, a crack occurs in the space SP3. In other words, since a space SP5 serves as a slit that prevents a crack from occurring, a crack does not occur in one or more of the layers underlying the metal line pattern that correspond to the space SP4. It is understood that the slit has to be formed parallel to the space between the metal line patterns in order to prevent a crack from occurring.

Figure 12:
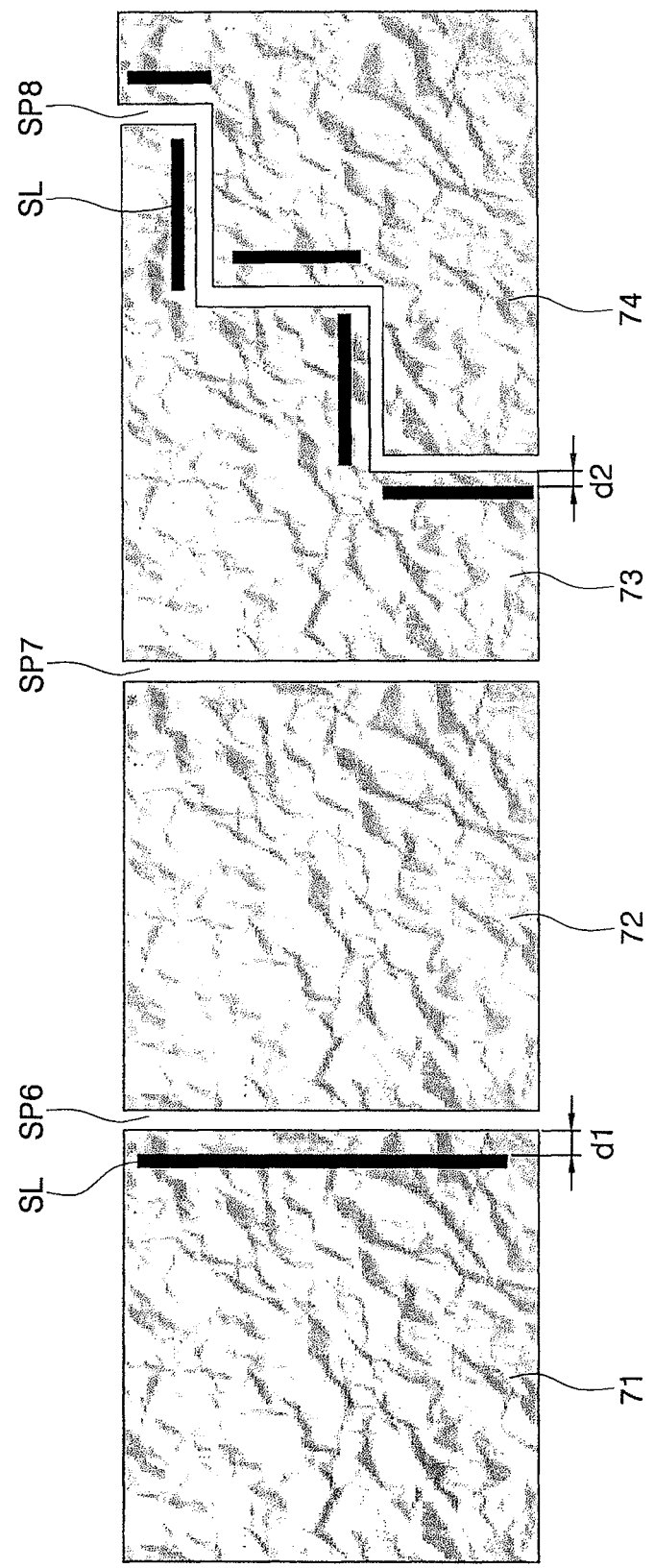
FIG. 12 is a SEM micrograph illustrating a front surface of a semiconductor device according to the second preferred embodiment of the present invention.

FIG. 12 is a SEM micrograph illustrating a front surface of a semiconductor device according to the second preferred embodiment of the present invention. As shown in FIG. 12, a space SP6 between metal line patterns 71 and 72 and a space SP7 between metal line patterns 72 and 73 are straight, whereas a space between two adjacent metal line patterns 73 and 74 is bent. The spaces SP6 to SP8 between two adjacent metal line patterns 71 and 72, 72 and 73, and 73 and 74, respectively have a width of less than 1.0 µm to achieve high integration. The metal line patterns 71 to 74 have a relatively large surface area size of, e.g., greater than 30 µm×30 µm. However, the surface area size of the metal line patterns is not limited to this value in the present invention.

In order to prevent a crack from occurring in one or more layers underlying the metal line layer, slits SL are formed at a predetermined distance from the space between the metal line patterns, and the slits SL are arranged in a direction parallel to the space between the metal line patterns. Preferably, the slit SL has a width of greater than 1.0 µm. The distances d1 and d2 between the slit SL and the corresponding space between the metal line patterns have a maximum value of, preferably, 4.0 µm. The length of the slit SL is selected such that the metal line patterns are not broken. In the case of the space SP8 that is bent, it is preferred that the slits SL are formed to correspond to straight portions of the bent space SP8. In other words, the slits SL are formed at a location adjacent to any portion of the space having a possibility to cause a crack.

A process of forming the slit in the metal line pattern according to the second preferred embodiment of the present invention does not require an additional mask process. The slit may be formed by patterning a portion of the metal line layer adjacent to the space between two adjacent metal line patterns concurrently with patterning the metal line layer.

Figure 13:
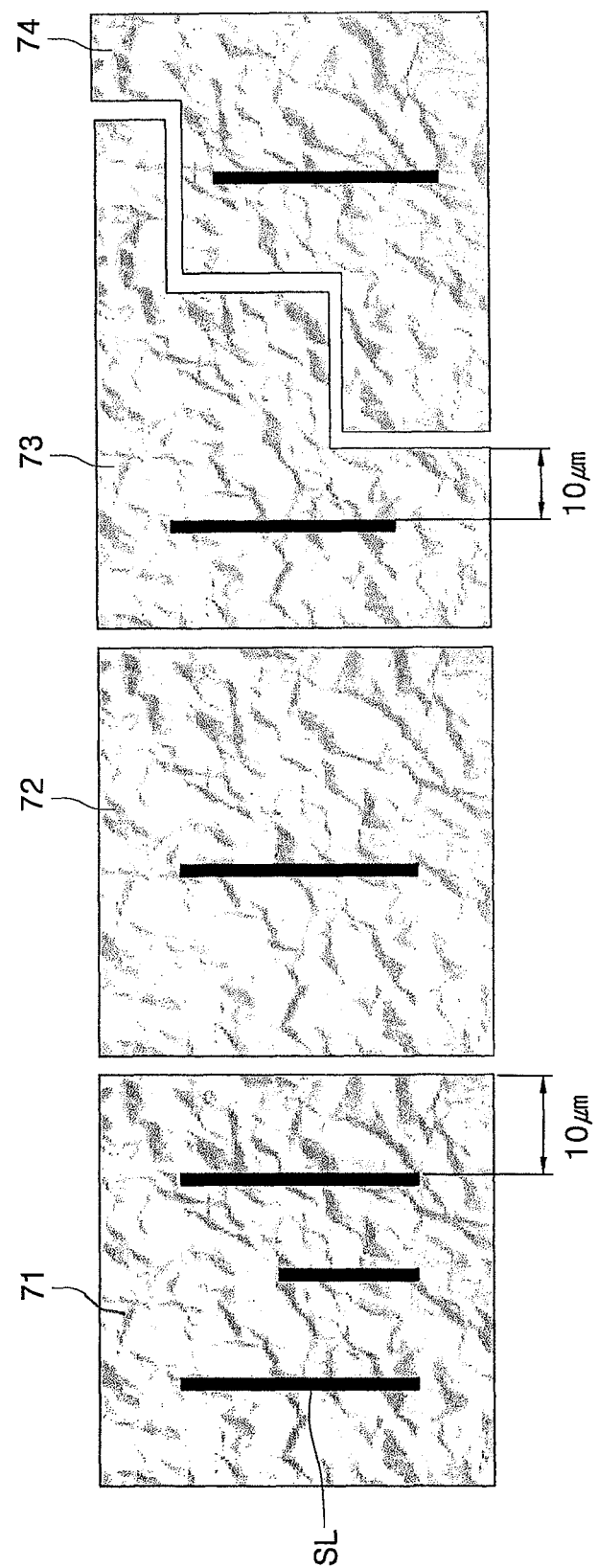
FIG. 13 illustrates slits further from the space between the metal lines.

FIG. 13 shows slits that are further from the space between the metal line patterns than 4.0 µm, e.g., about 10 µm.

Figure 14:
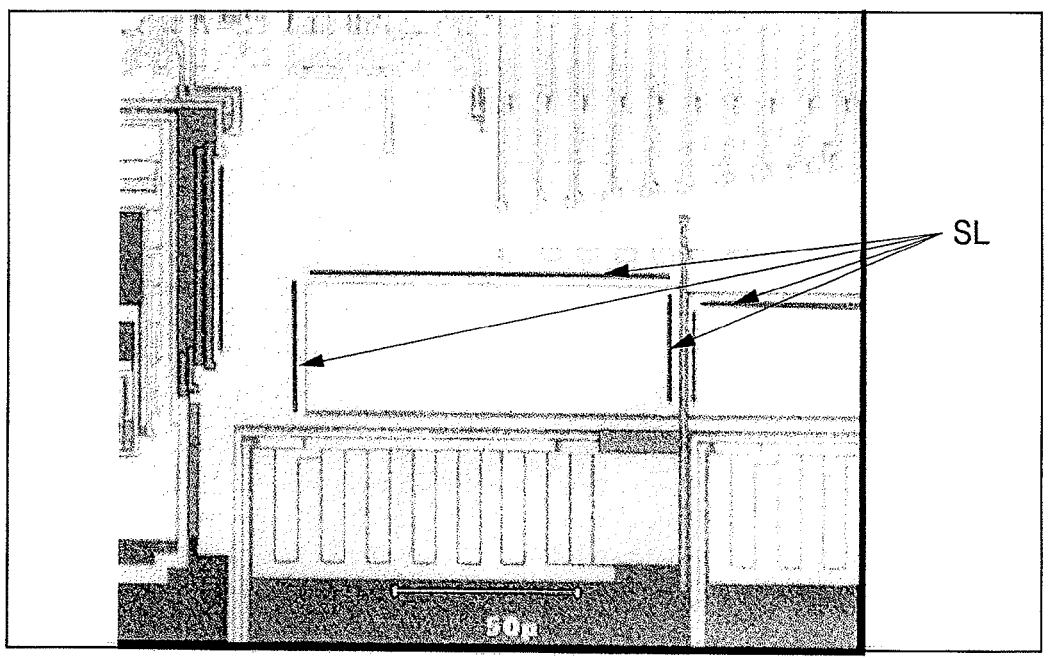
FIG. 14 is a SEM micrograph illustrating the slits formed to prevent a crack from occurring according to the second preferred embodiment of the present invention.

FIG. 14 is a SEM micrograph illustrating the slits formed to prevent a crack from occurring according to the second preferred embodiment of the present invention.

Figure 15:
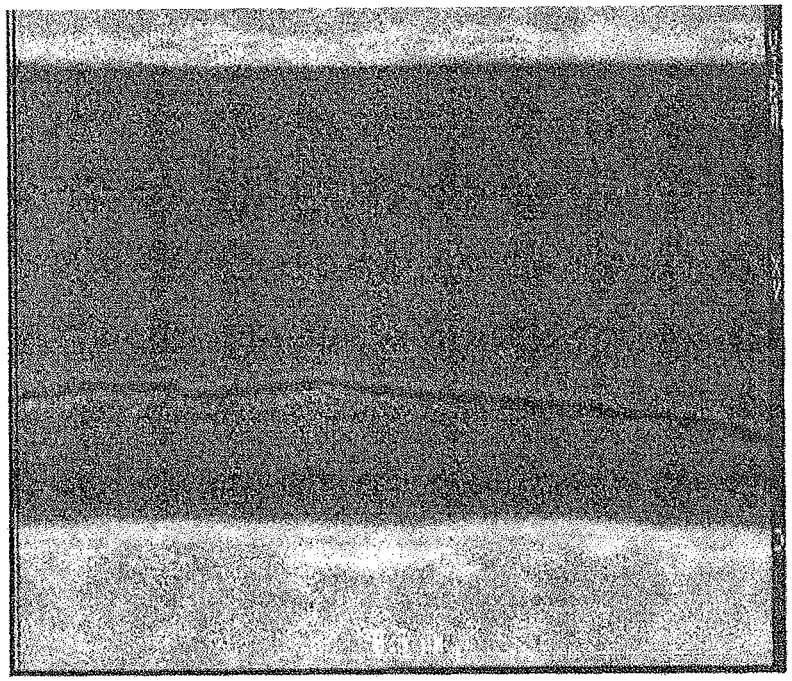
FIG. 15 is a SEM micrograph illustrating a conventional semiconductor device having a crack.
Figure 16:
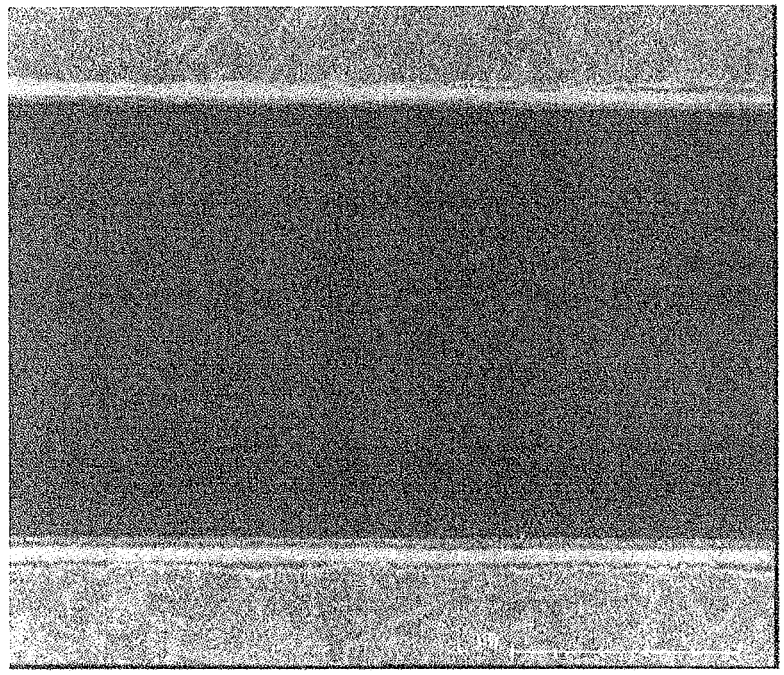
FIG. 16 is a SEM micrograph illustrating a semiconductor device having no cracks according to the preferred embodiments of the present invention.

FIG. 15 is a SEM micrograph illustrating a conventional semiconductor device having a crack, and FIG. 16 is a SEM micrograph illustrating the semiconductor device having no cracks according to the preferred embodiments of the present invention.

Figure 17:
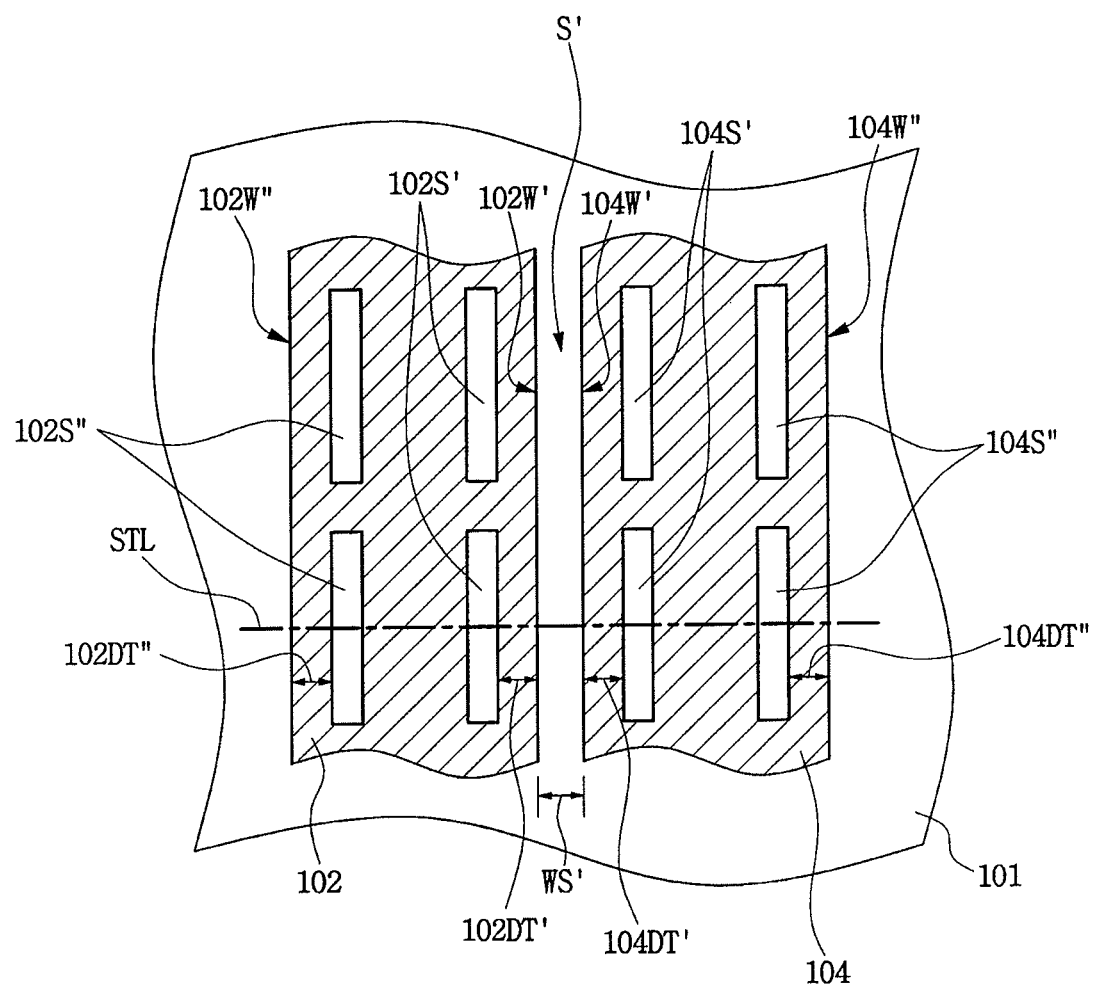
FIG. 17 illustrates a plan view of metal line patterns according to another embodiment of the present invention.

FIG. 17 illustrates a plan view of a pair of adjacent metal line patterns according to another embodiment of the present invention. Although the present embodiment is described in conjunction with two adjacent metal line patterns as shown in FIG. 17, the present embodiment is equally applicable to three or more adjacent metal line patterns.

Referring to FIG. 17, first and second metal line patterns 102 and 104 may be disposed on an underlying layer 101, e.g., an insulating layer. That is, the first and second metal line patterns 102 and 104 may be disposed on a same level. The first and second metal line patterns 102 and 104 may be separated from each other by a space S'. The space S' has a width WS' and the width WS' may have a single value. Alternatively, the width WS' may have two or more different values along the length direction of the metal line patterns 102 and 104. The first metal line pattern 102 may include a first inner wall 102W' facing the space S' and a first outer wall 102W" opposite the first inner wall 102W'. Similarly, the second metal line pattern 104 may include a second inner wall 104W' facing the space S' and a second outer wall 104W" opposite the second inner wall 104W'.

The first metal line pattern 102 may have a plurality of first slits therein, and the second metal line pattern 104 may have a plurality of second slits therein. In more detail, the first slits may include first inner slits 102S' disposed adjacent to the first inner wall 102W' and first outer slits 102S" adjacent to the first outer wall 102W". The first inner slits 102S' may be disposed to be parallel with the space S', and each of the first inner slits 102S' may be separated from the first inner wall 102S' by a first inner distance 102DT'. In addition, the first outer slits 102S" may be disposed to be parallel with the space S', and each of the first outer slits 102S" may be separated from the first outer wall 102W" by a first outer distance 102DT". The first inner distance 102DT' may be equal to the first outer distance 102DT". Alternatively, the first inner distance 102DT' may be different from the first outer distance 102DT". For example, the first inner distance 102DT' may be less than the first outer distance 102DT". Furthermore, the first inner slits 102S' may face the first outer slits 102S", respectively. In other words, one of the first inner slits 102S' and the first outer slit 102S" adjacent thereto may be disposed to have center points which are located on a straight line STL crossing the first and second metal line patterns 102 and 104.

Similarly, the second slits may include second inner slits 104S' disposed adjacent to the second inner wall 104W' and second outer slits 104S" adjacent to the second outer wall 104W". The second inner slits 104S' may be disposed to be parallel with the space S', and each of the second inner slits 104S' may be separated from the second inner wall 104S' by a second inner distance 104DT'. In addition, the second outer slits 104S" may be disposed to be parallel with the space S', and each of the second outer slits 104S" may be separated from the second outer wall 104W" by a second outer distance 104DT". The second inner distance 104DT' may be equal to the second outer distance 104DT". Alternatively, the second inner distance 104DT' may be different from the second outer distance 104DT". For example, the second inner distance 104DT' may be less than the second outer distance 104DT". Furthermore, the second inner slits 104S' may face the second outer slits 104S", respectively. In other words, one of the second inner slits 104S' and the second outer slit 104S" adjacent thereto may be disposed to have center points which are located on the straight line STL. As a result, the first inner slits 102S' may be disposed to face the second inner slits 104S', respectively.

Figure 18:
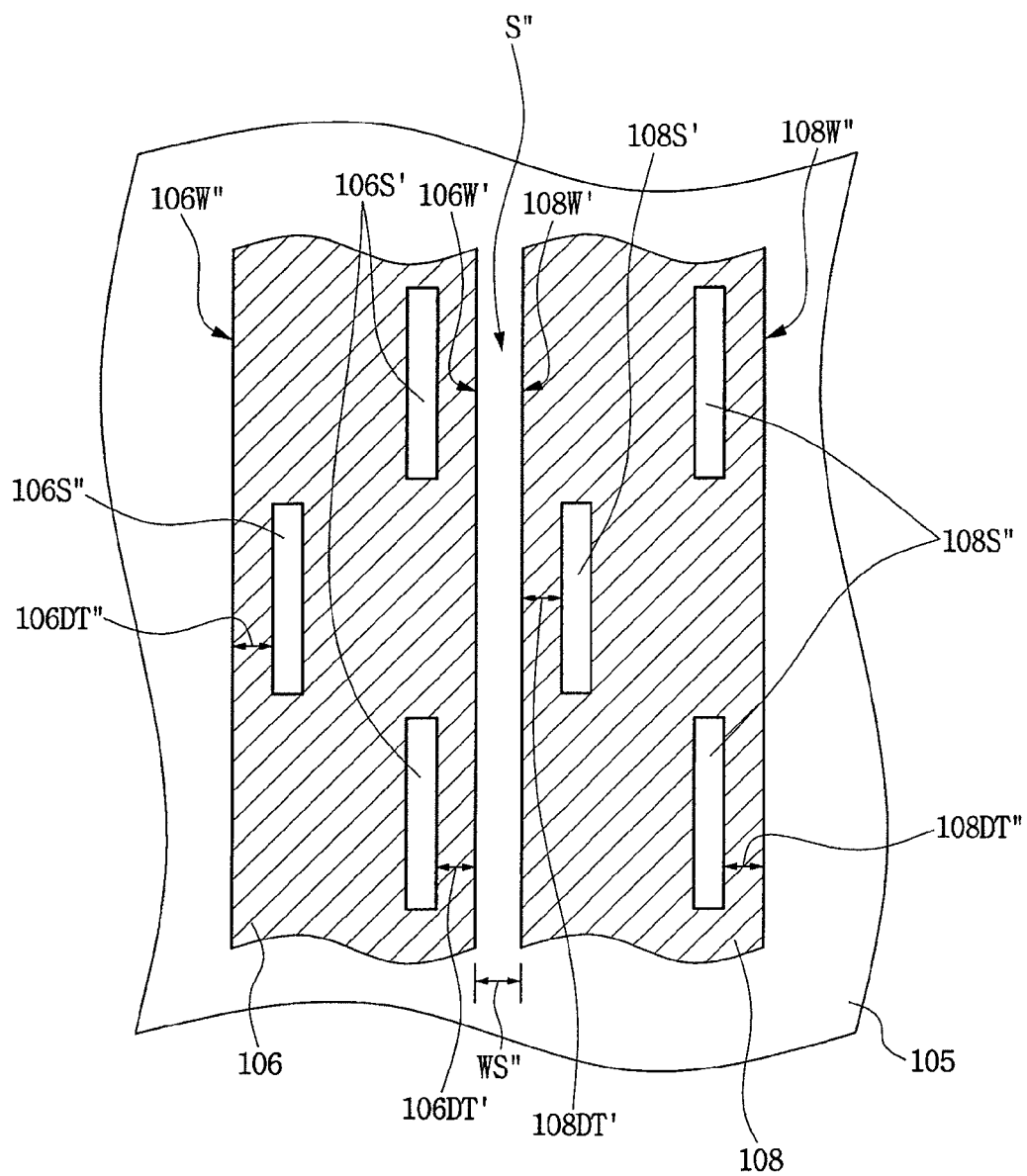
FIG. 18 illustrates a plan view of metal line patterns according to still another embodiment of the present invention.

FIG. 18 illustrates a plan view of a pair of adjacent metal line patterns according to still another embodiment of the present invention. Although the present embodiment is described in conjunction with two adjacent metal line patterns as shown in FIG. 18, the present embodiment is also applicable to three or more adjacent metal line patterns.

Referring to FIG. 18, first and second metal line patterns 106 and 108 may be disposed on an underlying layer 105, e.g., an insulating layer. That is, the first and second metal line patterns 106 and 108 may be disposed on a same level. The first and second metal line patterns 106 and 108 may be separated from each other by a space S". The space S" has a width WS" and the width WS" may have a single value. Alternatively, the width WS" may have two or more different values along the length direction of the metal line patterns 106 and 108.

The first metal line pattern 106 may include a first inner wall 106W' facing the space S" and a first outer wall 106W" opposite the first inner wall 106W'. Similarly, the second metal line pattern 108 may include a second inner wall 108W' facing the space S" and a second outer wall 108W" opposite the second inner wall 108W'.

The first metal line pattern 106 may have a plurality of first slits therein, and the second metal line pattern 104 may have a plurality of second slits therein. In more detail, the first slits may include odd-numbered first slits 106S' and even-numbered first slits 106S" disposed between the odd-numbered first slits 106S'. The odd-numbered first slits 106S' may be disposed adjacent to the first inner wall 106W', and the even-numbered first slits 106S" may be disposed adjacent to the first outer wall 106W". The first slits 106S' and 106S" may be parallel to the space S". Further, each of the odd-numbered first slits 106S' may be separated from the first inner wall 106W' by a first inner distance 106DT', and each of the even-numbered first slits 106S" may be separated from the first outer wall 106W" by a first outer distance 106DT". Accordingly, all of the first slits 106S' and 106S" may not be located on a single straight line which is parallel to the space S". The first inner distance 106DT' may be equal to or different from the first outer distance 106DT" as described with reference to FIG. 17.

Similarly, the second slits may include odd-numbered second slits 108S" and even-numbered second slits 108S' disposed between the odd-numbered second slits 108S". The odd-numbered second slits 108S" may be disposed adjacent to the second outer wall 108W", and the even-numbered second slits 108S' may be disposed adjacent to the second inner wall 108W'. The second slits 108S' and 108S" may be parallel to the space S". Further, each of the odd-numbered second slits 108S" may be separated from the second outer wall 108W" by a second outer distance 108DT", and each of the even-numbered second slits 108S' may be separated from the second inner wall 108W' by a second inner distance 108DT'. Accordingly, all of the second slits 108S' and 108S" may not be located on a single straight line which is parallel to the space S". The second inner distance 108DT' may be equal to or different from the second outer distance 108DT" as described with reference to FIG. 17.

In the aforementioned embodiments, the widths W11, W12, W21, W22, W31, W32, WS' and WS" of the spaces between the metal line patterns may be appropriately designed according to the process conditions for forming the metal line patterns and the underlying layer below the metal line patterns. Further, the distances d1, d2, 102DT', 102DT", 104DT', 104DT", 106DT', 106DT", 108DT' and 108DT" may also be appropriately designed according to the process conditions for forming the metal line patterns and the underlying layer below the metal line patterns. For example, even though some embodiments describe that the slits in the metal line patterns prevent the cracks from occurring in the underlying insulation layer when the space between the metal line patterns is less than about 1.5 µm, the space is not limited to the above value of about 1.5 µm. For example, slits may be provided in metal line patterns to prevent the cracks from occurring in the underlying insulation layer even when the space between the metal line patterns is greater than about 1.5 µm. This is because the stress applied to the underlying insulation layer may be changed according to the process conditions for forming the metal line patterns or the underlying insulation layer. The process conditions may include various factors such as thickness of the metal line patterns, material of the metal line patterns, material of the underlying insulation layer, and deposition techniques of the metal line patterns and the underlying insulation layer.

Similarly, even though some embodiments describe that the distance between the space and slit is preferably less than 4 µm to prevent the cracks from occurring in the underlying insulation layer when the space between the metal line patterns is less than about 1.5 µm, the distance is not limited to the above value of about 4 µm. For example, the distance may be greater than about 4 µm according to the process conditions for forming the metal line patterns and the underlying layer below the metal line patterns even when the space between the metal line patterns is less than about 1.5 µm.

The embodiments described above may be applicable to various semiconductor devices including integrated circuits. For example, the above embodiments of the present invention may be applicable to a volatile memory device such as a dynamic random access memory (DRAM) device or a static random access memory (SRAM) device, a non-volatile memory device such as a flash memory device, a non-memory device (e.g., a logic device) such as an application specific integrated circuit (ASIC) device, or an embedded memory logic (EML) device including volatile memory cells or non-volatile memory cells.

Figure 19:
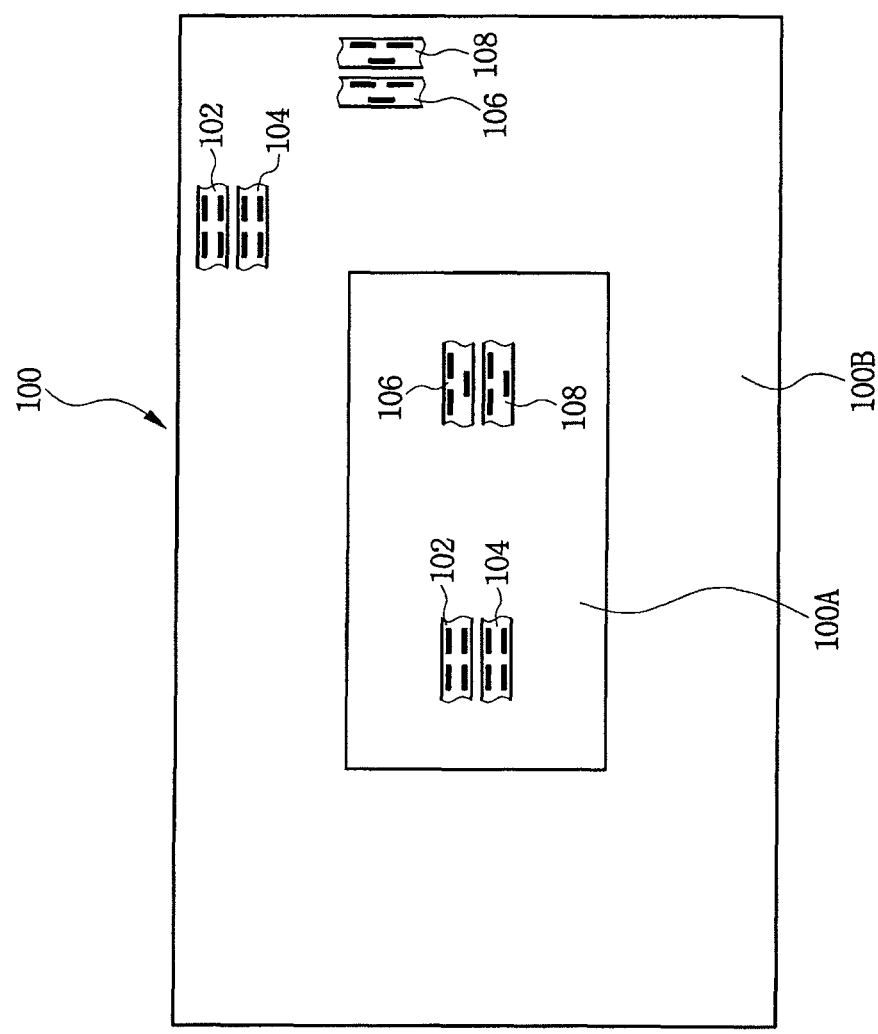
FIG. 19 illustrates a plan view of an exemplary semiconductor device having metal line patterns according to embodiments of the present invention.

FIG. 19 illustrates a plan view of an exemplary semiconductor device to which the metal line patterns according to the embodiments shown in FIGS. 17 and 18 may be applied. However, it will be apparent to those skilled in the art that the other metal line patterns according to the embodiments shown in FIGS. 5, 6, 7, 12, 13 and 14 may also be applicable to the semiconductor device of FIG. 19.

Referring to FIG. 19, the semiconductor device 100 may include a first region 100A and a second region 100B surrounding the first region 100A. In the event that the semiconductor device 100 is a memory device, the first region 100A may correspond to a cell array region and the second region 100B may correspond to a peripheral circuit region. Alternatively, when the semiconductor device 100 is a non-memory device, the first region 100A may correspond to a logic cell array region including logic gates, e.g., inverters, NAND gates or NOR gates, and the second region 100B may correspond to a peripheral circuit region including data input/output circuits.

The metal line patterns 102 and 104 shown in FIG. 17 or the metal line patterns 106 and 108 shown in FIG. 18 may be disposed in at least one of the first and second regions 100A and 100B, as shown in FIG. 19.

Figure 20:
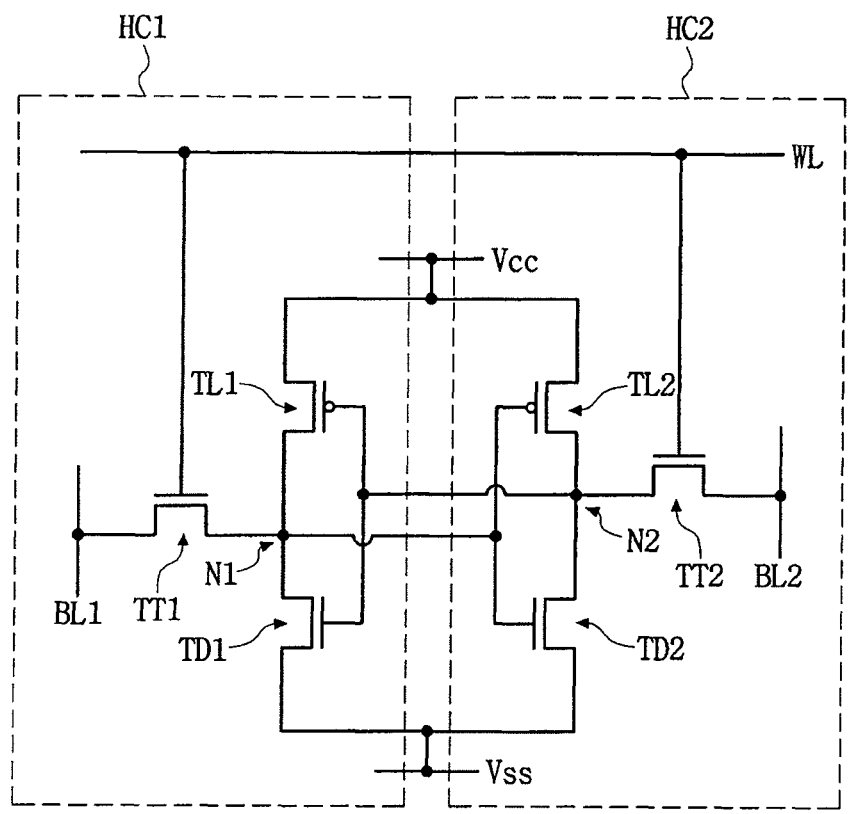
FIG. 20 illustrates an equivalent circuit diagram of a complementary metal-oxide-semiconductor static random access memory (CMOS SRAM) cell employed in a CMOS SRAM device.

In an exemplary embodiment, the metal line patterns 102 and 104 may be employed in the SRAM device including a CMOS SRAM cell shown in FIG. 20. However, it will be apparent to those skilled in the art that the metal line patterns according to the present invention may be applied to the other SRAM device including a load resistor SRAM cell that employs a pair of resistors as load devices.

FIG. 20 illustrates an equivalent circuit diagram of a CMOS SRAM cell, e.g., a bulk CMOS SRAM cell or a thin film transistor (TFT) CMOS SRAM cell. The bulk CMOS SRAM cell may include six bulk transistors formed at a semiconductor substrate, and the TFT CMOS SRAM cell may include at least two TFTs stacked over the semiconductor substrate.

Referring to FIG. 20, the CMOS SRAM cell may include a pair of driver transistors TD1 and TD2, a pair of transfer transistors TT1 and TT2, and a pair of load transistors TL1 and TL2. The pair of driver transistors TD1 and TD2 and the pair of transfer transistors TT1 and TT2 may be N-channel MOS transistors, while the pair of load transistors TL1 and TL2 may be P-channel MOS transistors.

The first driver transistor TD1 and the first transfer transistor TT1 may be serially connected to each other. A source region of the first driver transistor TD1 may be electrically connected to a ground line Vss, and a drain region of the first transfer transistor TT1 may be electrically connected to a first bit line BL1. Similarly, the second driver transistor TD2 and the second transfer transistor TT2 may be serially connected to each other. A source region of the second driver transistor TD2 may be electrically connected to the ground line Vss, and a drain region of the second transfer transistor TT2 may be electrically connected to a second bit line BL2.

Source and drain regions of the first load transistor TL1 may be electrically connected to a power supply line Vcc and a drain region of the first driver transistor TD1, respectively. Similarly, source and drain regions of the second load transistor TL2 may be electrically connected to the power supply line Vcc and a drain region of the second driver transistor TD2, respectively. The drain region of the first load transistor TL1, the drain region of the first driver transistor TD1 and the source region of the first transfer transistor TT1 may constitute a first node N1. In addition, the drain region of the second load transistor TL2, the drain region of the second driver transistor TD2 and the source region of the second transfer transistor TT2 may constitute a second node N2. Gate electrodes of the first driver transistor TD1 and the first load transistor TL1 may be electrically connected to the second node N2, and gate electrodes of the second driver transistor TD2 and the second load transistor TL2 may be electrically connected to the first node N1. Further, gate electrodes of the first and second transfer transistors TT1 and TT2 may be electrically connected to a word line WL.

As shown in FIG. 20, the CMOS SRAM cell may be divided into two half cells, e.g., a first half cell HC1 and a second half cell HC2. The first half cell HC1 may include the first driver transistor TD1, the first load transistor TL1 and the first transfer transistor TT1, and the second half cell HC2 may include the second driver transistor TD2, the second load transistor TL2 and the second transfer transistor TT2.

Figure 21:
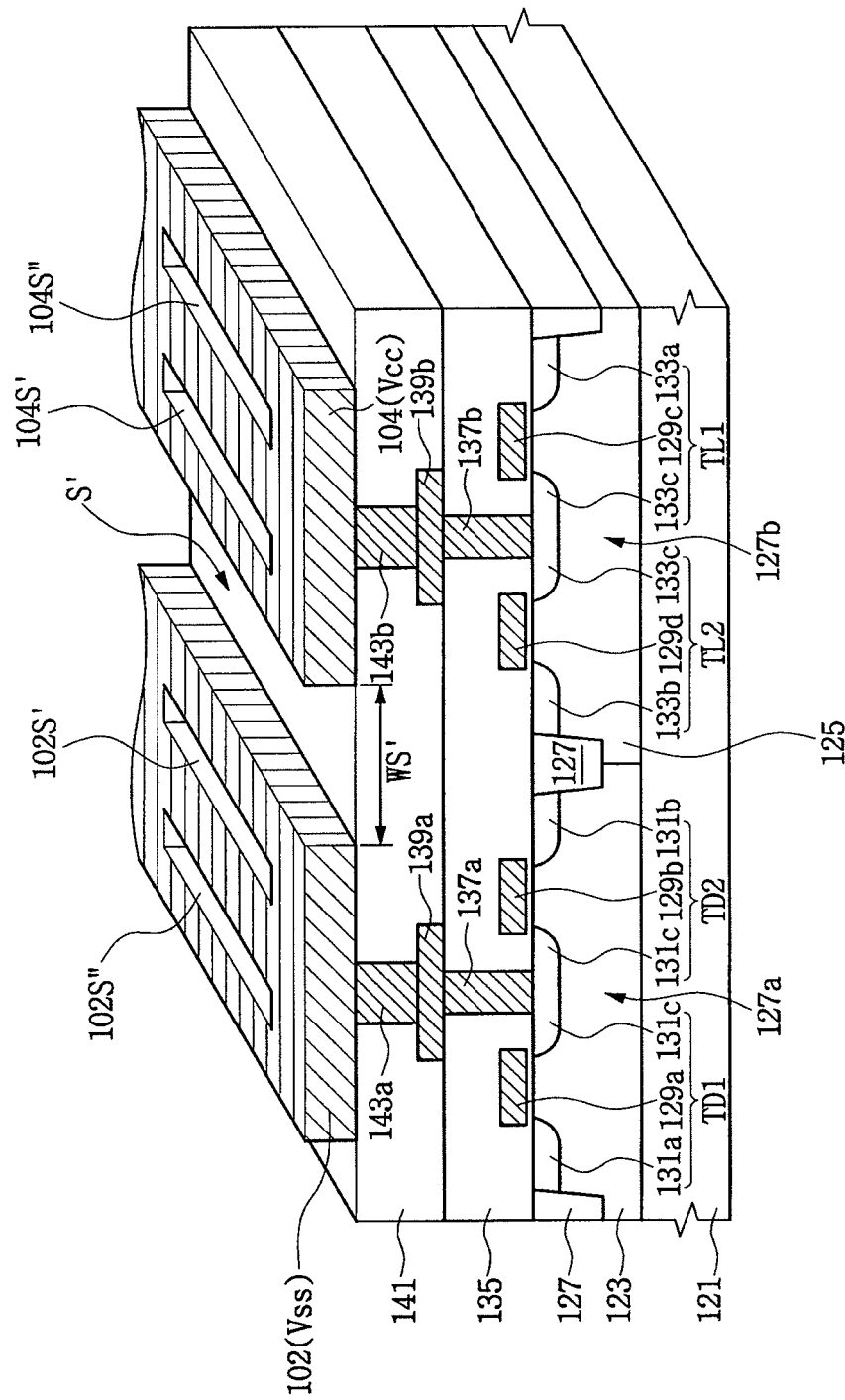
FIG. 21 illustrates a perspective view of a portion of a CMOS SRAM cell having metal line patterns according to embodiments of the present invention.

FIG. 21 illustrates a perspective view of a portion of an exemplary bulk CMOS SRAM cell with a pair of metal line patterns according to the embodiment shown in FIG. 17.

Referring to FIG. 21, a P-type well 123 and an N-type well 125 may be provided in a semiconductor substrate 121. An isolation layer 127 may be disposed at a predetermined region of the semiconductor substrate 121 to define a first active region 127a in the P-type well 123 and a second active region 127b in the N-type well 125. First to third N-type impurity regions 131a, 131b and 131c may be disposed in the first active region 127a. A first driver gate electrode 129a may be disposed over the first active region 127a between the first and third N-type impurity regions 131a and 131c, and a second driver gate electrode 129b may be disposed over the first active region 127a between the second and third N-type impurity regions 131b and 131c. The first driver gate electrode 129a, the first N-type impurity region 131a and the third N-type impurity region 131c may act as the gate electrode, the drain region and the source region of the first driver transistor TD1 shown in FIG. 20, respectively. Similarly, the second driver gate electrode 129b, the second N-type impurity region 131b and the third N-type impurity region 131c may act as the gate electrode, the drain region and the source region of the second driver transistor TD2 shown in FIG. 20, respectively.

First to third P-type impurity regions 133a, 133b and 133c may be disposed in the second active region 127b. A first load gate electrode 129c may be disposed over the second active region 127b between the first and third P-type impurity regions 133a and 133c, and a second load gate electrode 129d may be disposed over the second active region 127b between the second and third P-type impurity regions 133b and 133c. The first load gate electrode 129c, the first P-type impurity region 133a and the third P-type impurity region 133c may act as the gate electrode, the drain region and the source region of the first load transistor TL1 shown in FIG. 20, respectively. Similarly, the second load gate electrode 129d, the second P-type impurity region 133b and the third P-type impurity region 133c may act as the gate electrode, the drain region and the source region of the second load transistor TL2 shown in FIG. 20, respectively.

The substrate having the driver transistors TD1 and TD2, as well as the load transistors TL1 and TL2, may be covered with a first insulation layer 135. First and second pads 139a and 139b may be disposed on the first insulation layer 135. The first pad 139a may be electrically connected to the third N-type impurity region 131c though a first pad contact plug 137a that penetrates the first insulation layer 135, and the second pad 139b may be electrically connected to the third P-type impurity region 133c though a second pad contact plug 137b that penetrates the first insulation layer 135. The first and second pads 139a and 139b, as well as the first insulation layer 135, may be covered with a second insulation layer 141.

The plurality of metal line patterns described in the above embodiments, for example, the first and second metal line patterns 102 and 104 shown in FIG. 17 may be disposed on the second insulation layer 141. The first metal line pattern 102 may be electrically connected to the first pad 139a through a first metal line contact plug 143a that penetrates the second insulation layer 141, and the second metal line pattern 104 may be electrically connected to the second pad 139b through a second metal line contact plug 143b that penetrates the second insulation layer 141. As a result, the first metal line pattern 102 may act as the ground line Vss shown in FIG. 20, and the second metal line pattern 104 may act as the power supply line Vcc shown in FIG. 20.

Although not shown in FIG. 21, the metal line patterns 102 and 104 may extend so that they are disposed on a peripheral circuit region adjacent to the SRAM cell of FIG. 21.

According to the above embodiment, cracks may be prevented from being formed in the insulation layers 135 and 141 due to the presence of at least the inner slits 102S' in the first metal line pattern 102 or the inner slits 104S' in the second metal line pattern 104.

Figure 22:
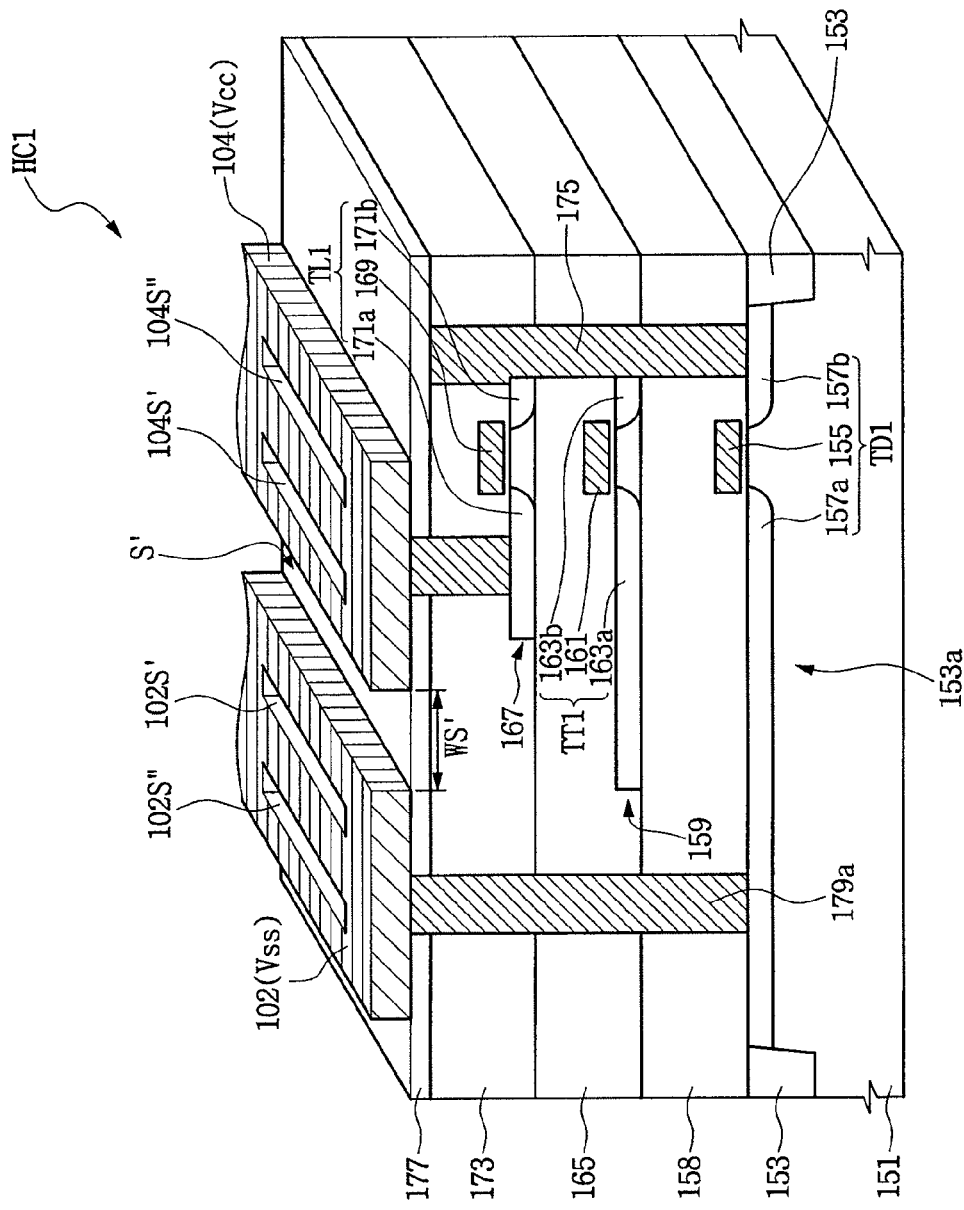
FIG. 22 illustrates a perspective view of a portion of another CMOS SRAM cell having metal line patterns according to embodiments of the present invention.

FIG. 22 illustrates a perspective view of a first half cell (HC1 of FIG. 20) of an exemplary TFT CMOS SRAM cell with a pair of metal line patterns according to the embodiment shown in FIG. 17.

Referring to FIG. 22, an isolation layer 153 may be disposed at a predetermined region of a semiconductor substrate 151 to define a first active region 153a. First and second N-type impurity regions 157a and 157b may be disposed in the first active region 153a. A first driver gate electrode 155 may be disposed over the first active region 153a between the first and second N-type impurity regions 157a and 157b. The first driver gate electrode 155, the first N-type impurity region 157a and the second N-type impurity region 157b may act as the gate electrode, the source region and the drain region of the first driver transistor TD1 shown in FIG. 20, respectively.

The substrate having the first driver transistor TD1 may be covered with a first insulation layer 158. A first semiconductor body 159 may be disposed on the first insulation layer 158. The first semiconductor body 159 may be a single crystalline semiconductor pattern. Third and fourth N-type impurity regions 163a and 163b may be disposed in the first semiconductor body 159, and a first transfer gate electrode 161 may be disposed over the first semiconductor body 159 between the third and fourth N-type impurity regions 163a and 163b. The first transfer gate electrode 161, the third N-type impurity region 163a and the fourth N-type impurity region 163b may act as the gate electrode, the drain region and the source region of the first transfer transistor TT1 shown in FIG. 20, respectively. As a result, the first transfer transistor TT1 of this embodiment may correspond to a thin film transistor.

The substrate having the first transfer transistor TT1 may be covered with a second insulation layer 165. A second semiconductor body 167 may be disposed on the second insulation layer 165. The second semiconductor body 167 may be a single crystalline semiconductor pattern. First and second P-type impurity regions 171a and 171b may be disposed in the second semiconductor body 167, and a first load gate electrode 169 may be disposed over the second semiconductor body 167 between the first and second P-type impurity regions 171a and 171b. The first load gate electrode 169, the first P-type impurity region 171a and the second P-type impurity region 171b may act as the gate electrode, the source region and the drain region of the first load transistor TL1 shown in FIG. 20, respectively. As a result, the first load transistor TL1 of this embodiment may also correspond to a thin film transistor.

The substrate including the first load transistor TL1 may be covered with a third insulation layer 173. The second N-type impurity region 157b, the fourth N-type impurity region 163b and the second P-type impurity region 171b may be electrically connected to a first node plug 175 that passes through the first, second and third insulation layers 158, 165 and 173. The first node plug may be a metal plug, e.g., a tungsten plug. The first node plug 175 and the third insulation layer 173 may be covered with a fourth insulation layer 177.

The plurality of metal line patterns described in the above embodiments, e.g., the first and second metal line patterns 102 and 104 shown in FIG. 17, may be disposed on the fourth insulation layer 177. The first metal line pattern 102 may be electrically connected to the first N-type impurity region 157a through a first metal line contact plug 179a that penetrates the first to fourth insulation layers 158, 165, 173 and 177, and the second metal line pattern 104 may be electrically connected to the first P-type impurity region 171a through a second metal line contact plug 179b that penetrates the third and fourth insulation layers 173 and 177. As a result, the first metal line pattern 102 may act as the ground line Vss shown in FIG. 20, and the second metal line pattern 104 may act as the power supply line Vcc shown in FIG. 20.

Alternatively, the TFT including the first semiconductor body 159 may act as the first load transistor TL1, and the TFT including the second semiconductor body 167 may act as the first transfer transistor TT1. In this case, the impurity regions 163a and 163b are P-type impurity regions and the impurity regions 171a and 171b are N-type impurity regions. Hence, the second metal line pattern 104 may be electrically connected to the impurity region 163a.

Although not shown in FIG. 22, the metal line patterns 102 and 104 may extend so that they are disposed on a peripheral circuit region adjacent to the SRAM cell of FIG. 22.

According to the above embodiment, cracks may be prevented from being formed in the fourth insulation layer 177 due to the presence of at least the inner slits 102S' in the first metal line pattern 102 or the inner slits 104S' in the second metal line pattern 104.

Figure 23:
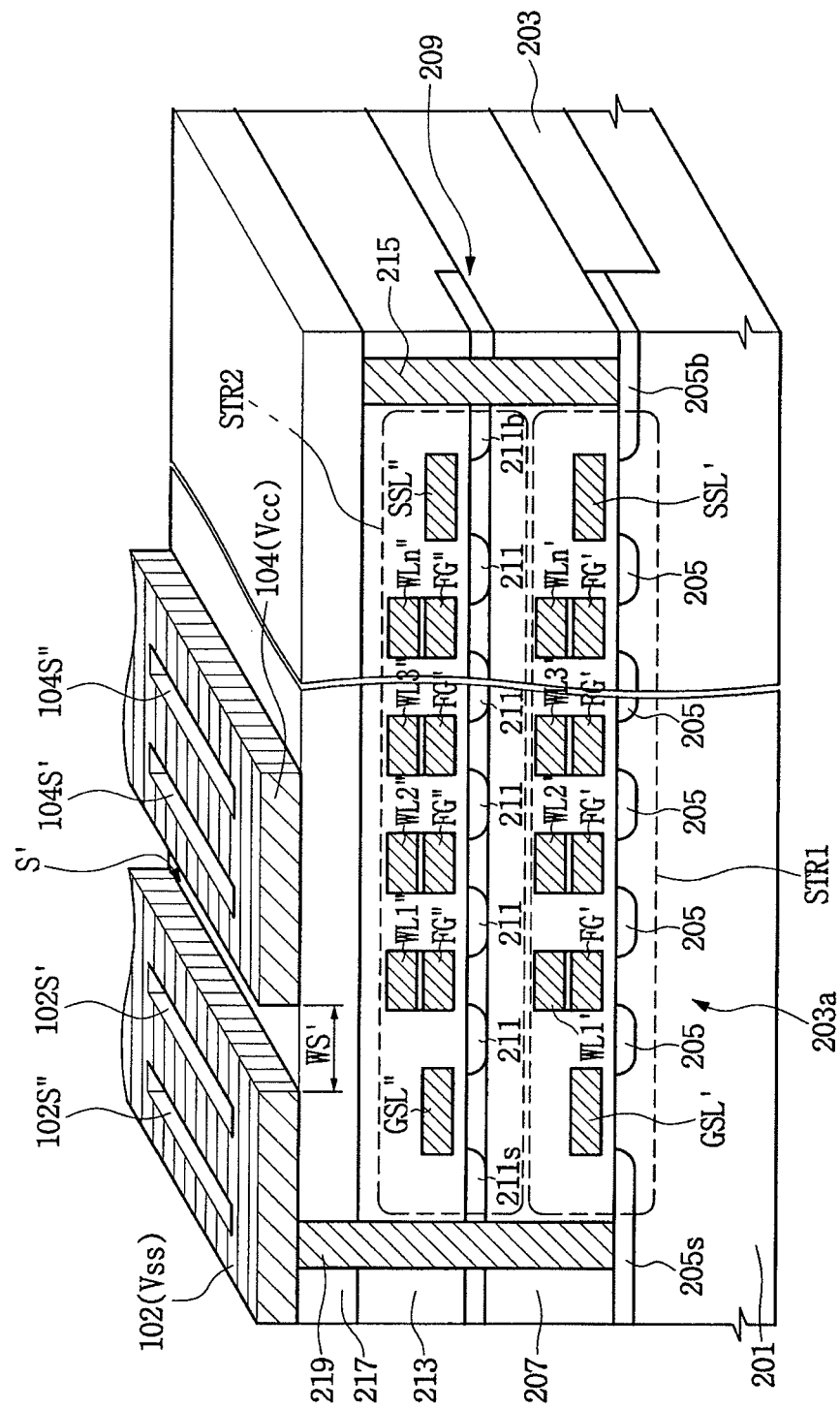
FIG. 23 illustrates a perspective view of a portion of a cell array region of a flash memory device having metal line patterns according to embodiments of the present invention.

The plurality of metal line patterns described in the above embodiments, e.g., the metal line patterns 102 and 104 shown in FIG. 17, may also be employed in the flash memory device including NAND strings, as shown in FIG. 23. However, it will be apparent to those skilled in the art that the metal line patterns according to the embodiments of the present invention may be applicable to all of non-volatile memory devices such as NOR-type flash memory devices, magnetic random access memory (MRAM) devices, phase change memory devices, resistive random access memory (RRAM) devices or the like. Further, although each of flash memory cells shown in FIG. 23 employs a stacked gate structure including a conductive floating gate and a control gate electrode which are sequentially stacked, embodiments of the present invention is not limited to the flash memory devices having the stacked gate structure. For example, embodiments of the present invention may also be applicable to the flash memory device employing silicon-oxide-nitride-oxide-silicon (SONOS) flash memory cells.

Referring to FIG. 23, an isolation layer 203 may be disposed at a predetermined region of a semiconductor substrate 201 to define a cell active region 203a. A lower ground selection line GSL' and a lower string selection line SSL' may be disposed to cross over the cell active region 203a. Further, a plurality of lower word lines WL1', WL2', WL3', ... and WLn' may be disposed between the lower ground selection line GSL' and the lower string selection line SSL'. A plurality of lower floating gates FG' may be disposed between the cell active region 203a and the lower word lines WL1', WL2', WL3', ... and WLn', respectively. A lower ground impurity region 205s may be provided in the cell active region 203a, adjacent to the lower ground selection line GSL' and opposite the lower string selection line SSL'. A lower bit line impurity region 205b may be provided in the cell active region 203a, adjacent to the lower string selection line SSL' and opposite the lower ground selection line GSL'. A plurality of lower source/drain regions 205 may be provided in the cell active region 203a between the lower ground impurity region 205s and the lower bit line impurity region 205b. The lower word lines WL1', ... and WLn', the lower floating gates FG', the lower ground selection line GSL', the lower string selection line SSL', the lower source/drain regions 205, the lower ground impurity region 205s, and the lower bit line impurity region 205b may constitute a lower NAND string STR1.

The lower ground selection line GSL', the lower ground impurity region 205s, and the lower source/drain region 205 adjacent to the lower ground selection line GSL' may constitute a lower ground selection transistor of the lower NAND string STR1. Similarly, the lower string selection line SSL', the lower bit line impurity region 205b, and the lower source/drain region 205 adjacent to the lower string selection line SSL' may constitute a lower string selection transistor of the lower NAND string STR1. The lower ground impurity region 205s may act as a source region of the lower ground selection transistor, and the lower bit line impurity region 205b may act as a drain region of the lower string selection transistor. In addition, the lower word lines WL1', ..., WLn', the lower floating gates FG', and the lower source/drain regions 205 may constitute a plurality of lower cell transistors which are serially connected to one another.

The substrate including the lower NAND string STR1 may be covered with a first insulation layer 207. A semiconductor body 209 may be disposed on the first insulation layer 207. The semiconductor body 209 may be a single crystalline semiconductor pattern. An upper ground selection line GSL" and an upper string selection line SSL" may be disposed to cross over the semiconductor body 209. Further, a plurality of upper word lines WL1", WL2", WL3", ... and WLn" may be disposed between the upper ground selection line GSL" and the upper string selection line SSL". A plurality of upper floating gates FG" may be disposed between the semiconductor body 209 and the upper word lines WL1", WL2", WL3", ... and WLn", respectively. An upper ground impurity region 211s may be provided in the semiconductor body 209 adjacent to the upper ground selection line GSL" and opposite the upper string selection line SSL". An upper bit line impurity region 211*b* may be provided in the semiconductor body 209 adjacent to the upper string selection line SSL" and opposite the upper ground selection line GSL". A plurality of upper source/drain regions 211 may be provided in the semiconductor body 209 between the upper ground impurity region 211*s* and the upper bit line impurity region 211*b*. The upper word lines WL1", . . . and WLn", the upper floating gates FG", the upper ground selection line GSL", the upper string selection line SSL", the upper source/drain regions 211, the upper ground impurity region 211*s*, and the upper bit line impurity region 211*b* may constitute an upper NAND string STR2.

The upper ground selection line GSL", the upper ground impurity region 211*s*, and the upper source/drain region 211 adjacent to the upper ground selection line GSL" may constitute an upper ground selection transistor of the upper NAND string STR2. Similarly, the upper string selection line SSL", the upper bit line impurity region 211*b*, and the upper source/drain region 211 adjacent to the upper string selection line SSL" may constitute an upper string selection transistor of the upper NAND string STR2. The upper ground impurity region 211*s* may act as a source region of the upper ground selection transistor, and the upper bit line impurity region 211*b* may act as a drain region of the upper string selection transistor. In addition, the upper word lines WL1", . . . , WLn", the upper floating gates FG", and the upper source/drain regions 211 may constitute a plurality of upper cell transistors which are serially connected to one another.

The substrate including the upper NAND string STR2 may be covered with a second insulation layer 213. The lower and upper bit line impurity regions 205*b* and 211*b* may be electrically connected to a bit line contact plug 215 that penetrates the first and second insulation layers 207 and 213. A third insulation layer 217 may be disposed on the second insulation layer 213.

The plurality of metal line patterns described in the above embodiments, e.g., the first and second metal line patterns 102 and 104 shown in FIG. 17, may be disposed on the third insulation layer 217. The first metal line pattern 102 may be electrically connected to the lower ground impurity region 205*s* and the upper ground impurity region 211*s* through a first metal line contact plug 219 that penetrates the first to third insulation layers 207, 213 and 217. Accordingly, the first metal line pattern 102 may correspond to a ground line Vss of a flash memory device. Further, the second metal line pattern 104 may correspond to a power supply line Vcc of a flash memory device.

Although not shown in FIG. 23, the metal line patterns 102 and 104 may extend so that they are disposed on a peripheral circuit region adjacent to the NAND strings of FIG. 23.

According to the above embodiment, cracks may be prevented from being formed in the third insulation layer 217 due to the presence of at least the inner slits 102S' in the first metal line pattern 102 or the inner slits 104S' in the second metal line pattern 104.

Figure 24:
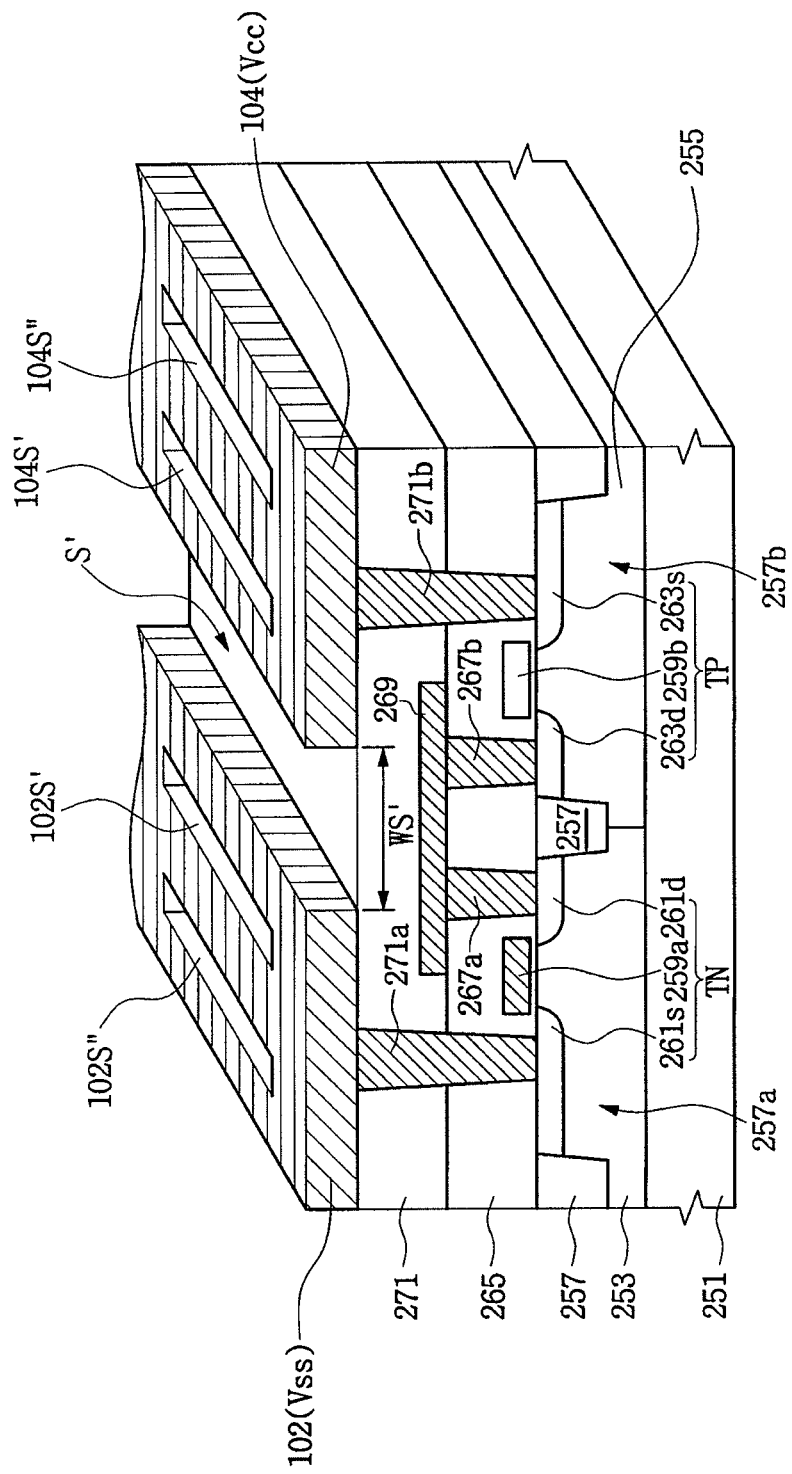
FIG. 24 illustrates a perspective view of a portion of a logic device having metal line patterns according to embodiments of the present invention.

The plurality of metal line patterns described in the above embodiments, e.g., the metal line patterns 102 and 104 shown in FIG. 17, may also be employed in the logic device including logic gates, as shown in FIG. 24.

Referring to FIG. 24, a P-type well 253 and an N-type well 255 may be provided in a semiconductor substrate 251. An isolation layer 257 may be disposed at a predetermined region of the semiconductor substrate 251 to define a first active region 257*a* in the P-type well 253 and a second active region 257*b* in the N-type well 255. An N-type source region 261*s* and an N-type drain region 261*d* may be disposed in the first active region 257*a*, and a P-type source region 263*s* and a P-type drain region 263*d* may be disposed in the second active region 257*b*. A first gate electrode 259*a* may be disposed over the first active region 257*a* between the N-type source region 261*s* and the N-type drain region 261*d*, and a second gate electrode 259*b* may be disposed over the second active region 257*b* between the P-type source region 263*s* and the P-type drain region 263*d*. The first gate electrode 259*a*, the N-type source region 261*s* and the N-type drain region 261*d* may constitute an N-channel MOS (NMOS) transistor TN, and the second gate electrode 259*b*, the P-type source region 263*s* and the P-type drain region 263*d* may constitute a P-channel MOS (PMOS) transistor TP.

The NMOS transistor TN and the PMOS transistor TP may be covered with a first insulation layer 265. A local interconnection 269 may be disposed on the first insulation layer 265. One end of the local interconnection 269 may be electrically connected to the N-type drain region 261*d* through a first drain contact plug 267*a* that penetrates the first insulation layer 265, and the other end of the local interconnection 269 may be electrically connected to the P-type drain region 263*d* through a second drain contact plug 267*b* that penetrates the first insulation layer 265. As a result, the local interconnection 269 electrically connects the N-type drain region 261*d* to the P-type drain region 263*d*. The local interconnection 269 and the first insulation layer 265 may be covered with a second insulation layer 271.

The plurality of metal line patterns described in the above embodiments, for example, the first and second metal line patterns 102 and 104 shown in FIG. 17, may be disposed on the second insulation layer 271. The first metal line pattern 102 may be electrically connected to the N-type source region 261*s* through a first metal line contact plug 271*a* that penetrates the first and second insulation layers 265 and 271, and the second metal line pattern 104 may be electrically connected to the P-type source region 263*s* through a second metal line contact plug 271*b* that penetrates the first and second insulation layers 265 and 271. As a result, the first metal line pattern 102 may act as a ground line Vss of the logic device, and the second metal line pattern 104 may act as a power supply line Vcc of the logic device.

According to the above embodiment, cracks may be prevented from forming in the second insulation layer 271 due to the presence of at least the inner slits 102S' in the first metal line pattern 102 or the inner slits 104S' in the second metal line pattern 104.

As described above, by providing an appropriate space between two adjacent metal line patterns or by forming a slit at a location adjacent to the space between two adjacent metal line patterns according to the embodiments of the present invention, an occurrence of a crack may be prevented or reduced, thereby leading to high reliability and a high manufacturing yield.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A semiconductor device, comprising:
   a semiconductor substrate;
   an integrated circuit on the semiconductor substrate;
   an insulation layer covering the integrated circuit; and
   a plurality of metal line patterns on the insulation layer,
      wherein first and second adjacent metal line patterns of
      the plurality of metal line patterns are spaced apart from each other by a space, and each of the first and second adjacent metal line patterns has at least one slit.

2. The semiconductor device as claimed in claim 1, wherein the space is less than about 10 µm.

3. The semiconductor device as claimed in claim 1, wherein the slits are less than about 4 µm away from the space.

4. The semiconductor device as claimed in claim 1, wherein the slits are parallel to the space.

5. The semiconductor device as claimed in claim 1, wherein the integrated circuit comprises at least one of a memory device, a logic device and an embedded memory logic device, and wherein at least one of the first and second metal line patterns is a ground line or a power supply line.

6. The semiconductor device as claimed in claim 5, wherein the integrated circuit includes the memory device, and the memory device is one of a static random access memory (SRAM) device, a flash memory device, and a phase change memory device.

7. The semiconductor device as claimed in claim 6, wherein the integrated circuit includes the SRAM device, and the SRAM device comprises a CMOS SRAM cell including a pair of driver transistors, a pair of load transistors and a pair of transfer transistors, and wherein the first metal line pattern is electrically connected to source regions of the pair of driver transistors and the second metal line pattern is electrically connected to source regions of the pair of load transistors.

8. The semiconductor device as claimed in claim 6, wherein the integrated circuit includes the flash memory device, and the flash memory device comprises a NAND string including a ground selection transistor, a plurality of cell transistors and a string selection transistor which are serially connected to one another, and wherein the first metal line pattern is electrically connected to a source region of the ground selection transistor.

9. The semiconductor device as claimed in claim 8, wherein the NAND string corresponds to a lower NAND string, and the semiconductor device further comprises an upper NAND string stacked over the lower NAND string, wherein the first metal line pattern is electrically connected to the upper NAND string.

10. A semiconductor device, comprising:
a semiconductor substrate;
an integrated circuit on the semiconductor substrate;
an insulation layer covering the integrated circuit;
first and second metal line patterns on the insulation layer, the first and second metal line patterns being parallel and spaced apart from each other, each of the first and second metal line patterns having at least one slit; and
a third metal line pattern on the insulation layer, the third metal line pattern being perpendicular to the first and second metal line pattern, the third metal line pattern having at least one slit.

11. The semiconductor device as claimed in claim 10, wherein the third metal line pattern is adjacent to the second metal line pattern and opposite to the first metal line pattern, and wherein the third metal line pattern is spaced apart from the second metal line pattern.

12. The semiconductor device as claimed in claim 11, wherein the third metal line pattern is spaced less than about 1 µm apart from the second metal line pattern.

13. The semiconductor device as claimed in claim 10, wherein the third metal line pattern is connected to the second metal line pattern and opposite to the first metal line pattern.

14. The semiconductor device as claimed in claim 10, wherein the integrated circuit comprises at least one of a memory device, a logic device, and an embedded memory logic device, and wherein at least one of the first and second metal line patterns is a ground line or a power supply line.

15. The semiconductor device as claimed in claim 14, wherein the integrated circuit includes the memory device, and the memory device is one of a static random access memory (SRAM) device, a flash memory device, and a phase change memory device.

16. The semiconductor device as claimed in claim 15, wherein the integrated circuit includes the SRAM device, and the SRAM device includes a CMOS SRAM cell having a pair of driver transistors, a pair of load transistors, and a pair of transfer transistors, and wherein the first metal line pattern is electrically connected to source regions of the pair of driver transistors and the second metal line pattern is electrically connected to source regions of the pair of load transistors.

17. The semiconductor device as claimed in claim 15, wherein the integrated circuit includes the flash memory, and the flash memory device includes a NAND string having a ground selection transistor, a plurality of cell transistors, and a string selection transistor which are serially connected to one another, and wherein the first metal line pattern is electrically connected to a source region of the ground selection transistor.

18. The semiconductor device as claimed in claim 17, wherein the NAND string corresponds to a lower NAND string, and the semiconductor device further comprises an upper NAND string stacked over the lower NAND string, wherein the first metal line pattern is electrically connected to the upper NAND string.

19. The semiconductor device as claimed in claim 14, wherein the integrated circuit includes the logic device, and the logic device comprises:
an N-channel MOS transistor having an N-type source region and an N-type drain region formed in the semiconductor substrate; and
a P-channel MOS transistor having a P-type source region and a P-type drain region formed in the semiconductor substrate,
wherein the first metal line pattern is electrically connected to the N-type source region of the N-channel MOS transistor, and the second metal line pattern is electrically connected to the P-type source region of the P-channel MOS transistor.

* * * * *